United States Patent
Yamasaki et al.

[11] Patent Number: 5,978,299
[45] Date of Patent: Nov. 2, 1999

[54] SEMICONDUCTOR MEMORY DEVICE HAVING A VOLTAGE LOWERING CIRCUIT OF WHICH SUPPLYING CAPABILITY INCREASES WHEN COLUMN SYSTEM IS IN OPERATION

[75] Inventors: Kyoji Yamasaki; Tadaaki Yamauchi; Mikio Asakura, all of Hyogo, Japan

[73] Assignee: Mitsubishi Denki Kabushiki Kaisha, Tokyo, Japan

[21] Appl. No.: 09/222,793

[22] Filed: Dec. 30, 1998

Related U.S. Application Data

[62] Division of application No. 08/795,529, Feb. 5, 1997, Pat. No. 5,875,145.

[30] Foreign Application Priority Data

Jun. 13, 1996 [JP] Japan ................................ 8-152430

[51] Int. Cl.⁶ ............................................ G11C 11/34
[52] U.S. Cl. .............................. 365/226; 365/230.06
[58] Field of Search ................................ 365/226, 227, 365/189.11, 230.06, 189.07

[56] References Cited

U.S. PATENT DOCUMENTS

| | | | |
|---|---|---|---|
| 5,276,652 | 1/1994 | Anami | 365/227 |
| 5,373,477 | 12/1994 | Sugibayashi | 365/226 |
| 5,579,524 | 11/1996 | Kinkinis | 365/227 |
| 5,751,639 | 5/1998 | Ohsawa | 365/227 |

FOREIGN PATENT DOCUMENTS

| | | |
|---|---|---|
| 61-121599 | 7/1986 | Japan . |
| 7-220472 | 8/1995 | Japan . |

Primary Examiner—A. Zarabian
Attorney, Agent, or Firm—McDermott, Will & Emery

[57] ABSTRACT

A semiconductor memory device includes a memory cell array, peripheral circuits including a column decoder for connecting a word line, and a VDC circuit for peripherals, for generating an internal power supply voltage based on an external power supply voltage. VDC circuit for peripherals supplies the internal power supply voltage to peripheral circuits including the column decoder, other than the sense amplifier, output buffer and internal initial stage. The supplying capability of the VDC circuit for peripherals is increased in response to a VDCE signal which is output from a clock generation circuit when column decoder is activated. Therefore, even when power consumption in the peripheral circuit is increased as the column decoder is activated, sufficient power can be supplied to the peripheral circuit.

1 Claim, 18 Drawing Sheets

SEMICONDUCTOR MEMORY DEVICE HAVING A VOLTAGE LOWERING CIRCUIT OF WHICH SUPPLYING CAPABILITY INCREASES WHEN COLUMN SYSTEM IS IN OPERATION

This application is a divisional of application Ser. No. 08/795,529 filed Feb. 5, 1997 U.S. Pat. No. 5,875,145.

BACKGROUND OF THE INVENTION

1. Field of the Invention

The present invention relates to a semiconductor memory device and, more specifically, to a semiconductor memory device including a circuit for supplying an internal power supply voltage to internal circuitry.

2. Description of the Background Art

Referring to FIG. 25, a semiconductor memory device 2600 includes a memory cell array 105 including a plurality of memory cells arranged in rows and columns, a plurality of word lines WL and bit lines BL connected to the plurality of memory cells, a row decoder 107 for selecting a word line in response to a row address, a sense amplifier 109 for amplifying data read from a memory cell to the bit line BL, an input initial stage 120 for converting an external signal to an internal signal, an address buffer 106 for converting an external address (hereinafter referred to as ext.Add) to an internal address, a column system 130 which operates in response to a column address, a boosted voltage generating circuit (hereinafter referred to as Vpp circuit) 118 for generating a boosted voltage Vpp, a voltage lowering circuit for sense amplifier supplying an internal power supply voltage to sense amplifier 109 (hereinafter referred to as a sense amplifier VDC (voltage down converter) circuit) 116, and a voltage lowering circuit for peripherals (hereinafter referred to as VDC circuit for peripherals) 2601 for supplying an internal power supply voltage to periphery circuits other than output buffer 122 in column system 130, sense amplifier 109 and input initial stage 120.

Input initial stage 120 includes an RAS buffer 101 for converting an external word address strobe signal (hereinafter referred to as an ext./RAS) to an internal row address strobe signal (hereinafter referred to as an int./RAS), a CAS buffer 102 for converting an external column address strobe signal (hereinafter referred to as an ext./CAS) to an internal column address strobe signal (hereinafter referred to as an int./CAS), a WE buffer 103 for converting an external write enable signal (hereinafter referred to an ext./WE) to an internal write enable signal (hereinafter referred to as an int./WE), and an output enable buffer (hereinafter referred to as an OE buffer) 104 for converting an external output enable signal (hereinafter referred to as an ext./OE) to an internal output enable signal (hereinafter referred to as an int./OE).

Column system 130 includes a column decoder 108 for selecting a bit line in response to a column address, a preamplifier 111 for amplifying data read from a memory cell connected to the selected bit line, an output buffer 112 for supplying output data to an external data input/output pin (hereinafter referred to as an ext.DQ pin), a clock generating circuit 113 for generating a clock signal for controlling preamplifier 111 and output buffer 112, a data input buffer 114 receiving input data from ext.DQ pin, and a write driver 115 for writing input data to the memory cell.

Referring to FIG. 26, the VDC circuit 2601 for peripherals includes an output node N1 for outputting an internal power supply voltage (hereinafter referred to as int.Vcc), a driver transistor 201 formed of a p channel MOS transistor (hereinafter referred to as a PMOS transistor), and a differential amplifier 205.

Driver transistor 201 has its source electrode connected to a power supply node to which an external power supply voltage (hereinafter referred to as ext.Vcc) is applied, its drain electrode connected to a non-inverted input terminal (+) of differential amplifier 205 as well as to output node N1, and its gate electrode connected to an output terminal of differential amplifier 205. To the inverted terminal (−) of differential amplifier 205, a reference voltage Vref is applied.

In VDC circuit 2601 for peripherals, the voltage int. Vcc at output node N1 is compared with reference voltage Vref, and gate voltage of PMOS transistor 205 is controlled such that int.Vcc becomes equal to the reference voltage Vref. As a result, int.Vcc is generated based on ext.Vcc, and supplied to the peripheral circuits of the semiconductor memory device 2600.

In semiconductor memory device 2600, ext./RAS and ext./CAS are converted to int./RAS and int./CAS by RAS buffer 101 and CAS buffer 102, respectively. Here, when ext.Add is input and taken in the address buffer 106, row and column addresses are generated. A memory cell connected to the word line and bit line corresponding to the row and column addresses is selected, and data is read from or written to the selected memory cell.

At the time of data reading, a word line corresponding to the row address is selected by row decoder 107, and data is read to a plurality of bit lines from a plurality of memory cells connected to the selected word line, and the data is amplified by sense amplifier 109. In response to a column address, a bit line is selected, and the amplified data is transmitted from the selected bit line through an input/output line (hereinafter referred to as an I/O line) 110 through preamplifier 11. Data is further amplified by preamplifier 11 and output to ext.DQ pin through output buffer 112. Timing of output from preamplifier 111 and output buffer 112 as well as the timing of equalization are controlled by the clock signal from clock generating circuit 113.

At the time of data writing, data input through ext.DQ pin is transmitted to write driver 115 through data in buffer 114. Similar to the reading operation, a word line corresponding to the row address is selected by row decoder 107, and thereafter a bit line corresponding to the column address is selected by column decoder 108. The data from write driver 115 is applied to the selected bit line through I/O line 110, and written to the memory cell connected to the word line and a bit line.

Therefore, in one cycle of reading/writing operation, the power consumption of the semiconductor memory device increases only when the peripheral circuitry, mainly the column system 130 operating in response to the column address, is in operation.

However, when the gain of the VDC circuit 2601 for peripherals is increased to improve supplying capability of int.Vcc of the VDC circuit 2601 for peripherals provided in the conventional semiconductor memory device 2600 shown in FIG. 25, there is a possibility of oscillation if the gain is too large, as the VDC circuit 2601 for peripherals shown in FIG. 26 has the voltage at output node N1 fed back.

Referring to FIG. 27, another conventional semiconductor memory device 2800 includes, in stead of preamplifier 111, output buffer 112, data in buffer 114 and write driver 115 of the semiconductor memory device 2600 of FIG. 25, preamplifiers 111a and 111b, output buffers 112a and 112b, data in buffers 114a and 114b, as well as write drivers 115a and 115b.

In this device, input/output circuits 1, 2 having a plurality of ext.DQ pins are provided, and between the input/output circuits 1, 2 and VDC circuit 2601 for peripherals, a pad 1705 which is selectively connected to ext.Vcc or to the GND is further provided.

Other circuit configuration and operation are the same as the semiconductor memory device 2600. Therefore, description thereof is not repeated.

The semiconductor memory device 2800 allows selection of any of a plurality of word configurations, for example, ×1, ×4, ×8, and ×16 words configurations. When the ×4 word configuration is selected, four bits of data are simultaneously input/output in response to an applied one address. The word configuration is selected by an activating signal generated based on the voltage on pad 1705.

In the semiconductor memory device which allows selection of word configurations, the larger the number of data to be input/output, the larger the peripheral circuitry. Therefore, when a larger word configuration is selected, power consumption increases. Therefore, as in the column system operation described above, when the supplying capability of VDC 2601 for peripherals is to be increased, there is higher possibility of oscillation of VDC circuit 2601 for peripherals.

SUMMARY OF THE INVENTION

An object of the present invention is to provide a semiconductor memory device capable of supplying sufficient and stable int.Vcc in accordance with increase of the peripheral circuitry.

According to one aspect of the present invention, the semiconductor memory device includes a memory cell array, peripheral circuitry and an internal power supply circuit. The memory cell array includes a plurality of memory cells arranged in rows and columns. The peripheral circuitry includes a column decoder for selecting a column. The internal power supply circuit generates an internal power supply voltage based on an external power supply voltage, supplies the generated internal power supply voltage to the peripheral circuitry, and has supplying capability which increases when the column decoder is activated.

One advantage of the present invention is that the supplying capability for supplying the internal power supply voltage is increased when the column decoder is activated, so that the increase in power consumption when the column decoder is activated can be sufficiently made up for.

According to another aspect of the present invention, a semiconductor memory device which allows selection between a first word configuration and a second word configuration which has larger number of words includes a memory cell array, first and second input/output circuits, an activating circuit and an internal power supply circuit. The memory cell array includes a plurality of memory cells. The first input/output circuit inputs/outputs a first number of data in parallel to/from the memory cell array. The second input/output circuit inputs/outputs a second number of data in parallel to/from the memory cell. The activating circuit activates the internal power supply circuit and the second input/output circuit when the second word configuration is selected. The internal power supply circuit generates an-internal power supply voltage based on an external power supply voltage, supplying the generated internal power supply voltage to the first and second input/output circuits and has a supplying capability which increases when the second word configuration is selected.

Another advantage of the present invention is that the supplying capability of the internal power supply voltage is increased when the second word configuration is selected so that the increase in power consumption when the second word configuration is selected can be sufficiently made up for.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
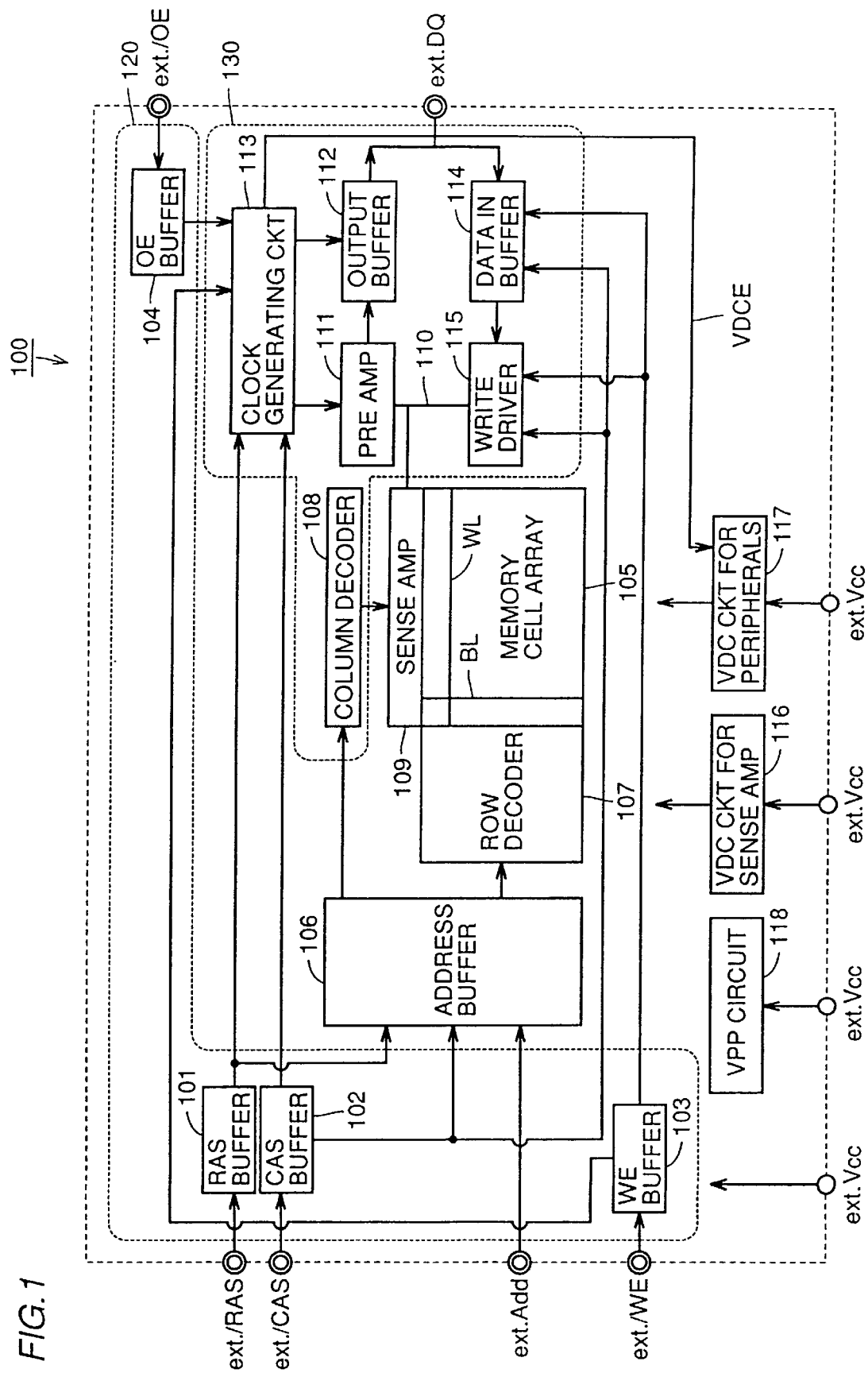
FIG. 1 is a block diagram showing a structure of a semiconductor memory device in accordance with a first embodiment of the present invention.

In the following, embodiments of the present invention will be described with reference to the figures. In the figures, same reference characters denote the same or corresponding portions.

(1) First Embodiment

Referring to FIG. 1, the semiconductor memory device 100 in accordance with a first embodiment of the present invention includes a memory cell array 105 including a plurality of memory cells (not shown) arranged in rows and columns; a plurality of word lines WL connected to a plurality of memory cells; a plurality of bit lines connected to the plurality of memory cells and crossing the plurality of word lines WL; a row decoder 107 for selecting a word lines WL in response to a row address; an input initial stage 120 for converting an external signal to an internal signal; an address buffer 106 for converting an external address to an internal address; a column system 130 which operates in response to a column address; a Vpp circuit 118 for generating a boosted voltage Vpp; a VDC circuit 116 for a sense amplifier for supplying an internal power supply voltage to sense amplifier 109; and a VDC circuit 117 for peripherals, for supplying an internal power supply voltage to peripheral circuits other than output buffer 112 of column system 130, input initial stage 120 and sense amplifier 109.

The input initial stage 120 includes an RAS buffer 101 for converting ext./RAS to int./RAS, a CAS buffer 102 for converting ext./CAS to int./CAS, a WE buffer 103 for converting /WE to int./WE, and an OE buffer 104 for converting ext./OE to int./OE.

Column system 130 includes a column decoder 108 for selecting a bit line BL in response to a column address; a preamplifier 111 for amplifying data supplied through an I/O line from the selected bit line BL; an output buffer 112 for supplying output data to ext.DQ pin; a clock generating circuit 113 for generating a clock signal for controlling timings of output of preamplifier 111 and output buffer 112 and of equalization; a data in buffer 114 for receiving input data from ext.DQ pin; and a write driver 115 for writing input data to the memory cell.

RAS buffer 101 is connected to clock generating circuit 113 and address buffer 106. CAS buffer 102 is connected to clock generating circuit 113, address buffer 106, data in buffer 114 and write driver 115. WE buffer 103 is connected to clock generating circuit 113, data in buffer 104 and write driver 115. OE buffer 104 is connected to clock generating circuit 113.

Address buffer 106 is connected to row decoder 107 and column decoder 108. Row decoder 107 is connected to a plurality of word lines WL in memory cell array 105. Sense amplifier 109 is connected to a plurality of bit lines BL in memory cell array 105. The plurality of memory cells are arranged at cross points between the plurality of word lines WL and the plurality of bit lines BL. Sense amplifier 109, preamplifier 111 and write driver 115 are connected by means of I/O line 110.

Vpp circuit 118 is connected to an internal circuit (for example, row decoder 107) of semiconductor memory device 100, and supplies a boosted voltage Vpp generated based on ext.Vcc to the internal circuit. VDC circuit 116 for sense amplifier is mainly connected to sense amplifier 109, and supplies int.Vcc generated based on ext.Vcc to sense amplifier 109. VDC circuit 1117 for peripherals is connected to clock generating circuit 113 and receives a VDCE signal, which will be described later. VDC circuit 117 for peripherals is also connected to peripheral circuits (not shown) other than input initial stage 120, output buffer 112 and sense amplifier 109, and supplies int.Vcc generated based on ext.Vcc to the peripheral circuit.

In semiconductor memory device 100, ext./RAS and ext./CAS are converted to int./RAS and int./CAS by RAS buffer 101 and CAS buffer 102, respectively. When the input ext.Add is taken in the address buffer 106, row and column addresses are generated. In response to the falls of int.RAS and int.CAS, the word line WL corresponding to the row address and the bit line BL corresponding to the column address are selected, and data is read from or written to the memory cell connected to the word line WL and the bit line BL.

At the time of data reading, first, a word line WL corresponding to the row address is selected by row decoder 107, and data is read from the plurality of memory cells connected to the word line WL to a plurality of bit lines BL. The read data is amplifier by sense amplifier 109. Thereafter, a bit line BL corresponding to the column address is selected by the column decoder 108, and from the bit line BL, data is transmitted through I/O line 110 to preamplifier 111. The transmitted data is further amplified by preamplifier 11 and output to ext.DQ pin through output buffer 112. In response to the clock signal from clock generating circuit 113, timings of output from preamplifier 111 and output buffer 112 as well as the timing of equalization are controlled.

Meanwhile, at the time of data writing, data input through ext.DQ pin is transmitted through data in buffer 114 to write driver 115. Similar to the data reading operation described above, first, a word line WL corresponding to the row address is selected by row decoder 107, and thereafter, a bit line BL corresponding to the column address is selected by column decoder 108. The data from write driver 115 is written to the memory cell connected to the selected word line WL and selected bit line BL through I/O line 110.

Figure 2:
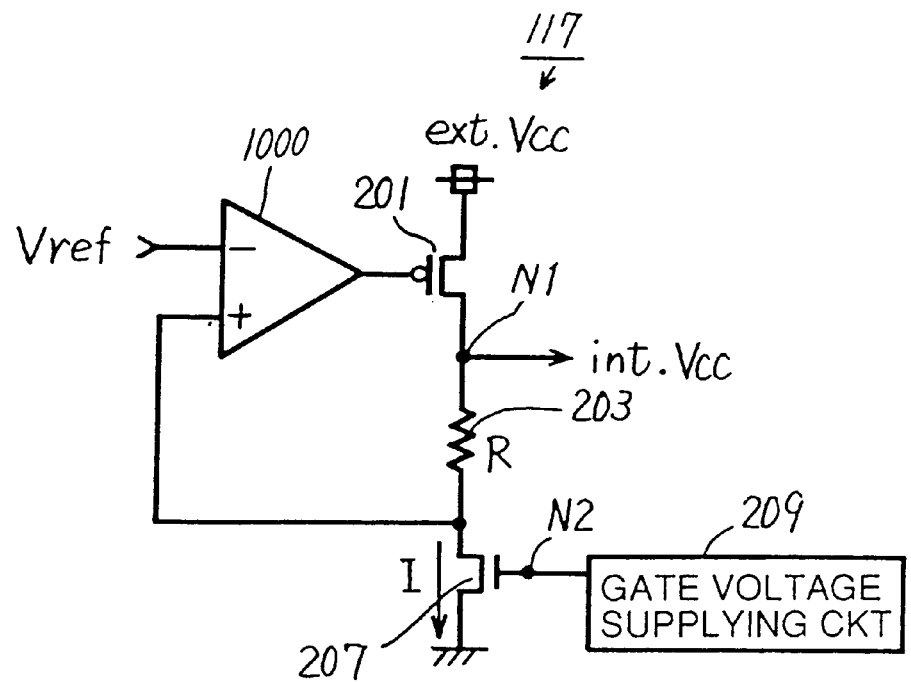
FIG. 2 is a schematic diagram showing an example of the VDC circuit for peripherals shown in FIG. 1.

The VDC circuit 117 for peripherals shown in FIG. 1 includes, referring to FIG. 2, for example, a driver transistor 201, a high resistance element 203, a differential amplifier 1000, a control transistor 207 formed of an NMOS transistor, and a gate voltage supplying circuit 209.

Driver transistor 201 has its source electrode connected to an external power supply node, its drain electrode connected to an output node N1, and its gate electrode connected to an output terminal of differential amplifier 1000. High resistance element 203 has one end connected to output node N1, and the other end connected to the drain electrode of control transistor 207. Control transistor 207 has its source electrode grounded, and its gate electrode connected to gate voltage supplying circuit 209. A non-inverted input terminal (+) of differential amplifier 1000 is connected to the other end of high resistance element 203, and to an inverted input terminal (−), a reference voltage Vref is applied.

Here, a PMOS transistor may be inserted instead of high resistance element 203. Further, for lowering voltage, a diode connected PMOS transistor may be inserted between high resistance element 203 and control transistor 207.

In VDC circuit 117 for peripherals, int.vcc is divided by high resistance 203 (having the resistance value of R), and a voltage lower than int.Vcc by ΔV (=RI) is fed back. Consequently, the gain of the VDC circuit 117 for peripherals can be increased. Here, I represents current flowing through control transistor 207.

Since control transistor 207 operates in a saturation region, current I depends on gate voltage $V_{G1}$. When gate voltage $V_{G1}$ is made constant, current I can be kept constant. As a result, the gain of the VDC circuit 117 for peripherals can be increased stably.

Figure 3:
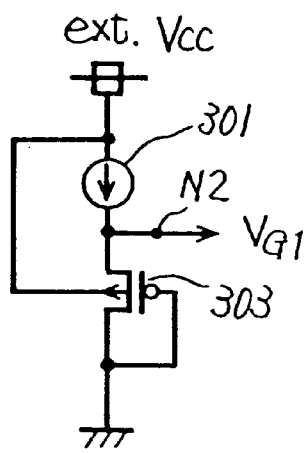
FIG. 3 is a schematic diagram showing a conventional gate voltage supplying circuit.

Referring to FIG. 3, a conventional gate voltage supplying circuit 309 includes a constant current source 301 and a load transistor 303 formed of a PMOS transistor.

In gate voltage supplying circuit 309, a constant current source 301 is connected between an external power supply node and a gate voltage supplying node N2. PMOS transistor 303 has its source electrode connected to gate voltage supplying node N2, gate and drain electrodes grounded and its back gate electrode connected to the external power supply node.

In this manner, in the conventional gate voltage supplying circuit 309, the gate voltage $V_{G1}$ has high ext.Vcc dependency, because of substrate effect of PMOS transistor 303. Accordingly, int.Vcc also has high ext.Vcc dependency. Therefore, when the gate voltage supplying circuit 309 is used in the VDC circuit 117 for peripherals shown in FIG. 2, the current I flowing through control transistor 207 is not stable, and hence the gain of VDC circuit 117 for peripherals cannot be increased stably.

Figure 4:
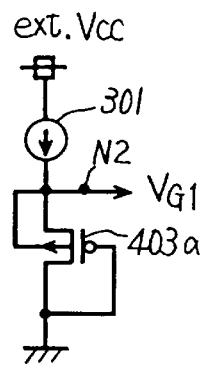
FIG. 4 is a schematic diagram showing another example of the gate voltage supplying circuit shown in FIG. 2.

The gate voltage supplying circuit 209 shown in FIG. 2 includes, as shown in FIG. 4, for example, a constant current source 301 and a PMOS transistor 403a.

Constant current source 401 is connected between an external power supply node and gate voltage supplying node N2. PMOS transistor 403a has its source and back gate electrode connected to gate voltage supplying node N2, and its gate and drain electrodes grounded.

In this manner, since back gate electrode of PMOS transistor 403a is connected to the gate voltage supplying node N2, the substrate effect is eliminated. As a result, the gate voltage $V_{G1}$ does not depend on ext.Vcc, and hence an approximately constant gate voltage $V_{G1}$ is supplied to the gate voltage supplying node N2. Therefore, current I flowing through control transistor 207 of VDC circuit 117 for peripherals shown in FIG. 2 is stabilized, and hence the gain of the VDC circuit 117 for peripherals can be increased stably.

Figure 5:
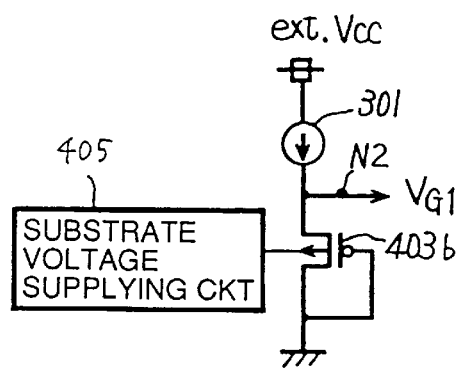
FIG. 5 is a schematic diagram showing another example of the gate voltage supplying circuit shown in FIG. 2.

Further, referring to FIG. 5, the back gate electrode of PMOS transistor 403a may be connected to the output node of substrate voltage supplying circuit 405, instead of gate voltage supplying node N2.

In this manner, when the substrate voltage is supplied to the back gate electrode of PMOS transistor 403b, the substrate effect is eliminated. As a result, the gate voltage $V_{G1}$ does not depend on ext.Vcc, and approximately constant gate voltage $V_{G1}$ is supplied to the gate voltage supplying node N2. Consequently, the current I flowing through control transistor 207 of Vcc circuit 117 for peripherals shown in FIG. 2 is stabilized, and hence the gain of the Vcc circuit 117 for peripherals can be increased stably.

Figure 6:
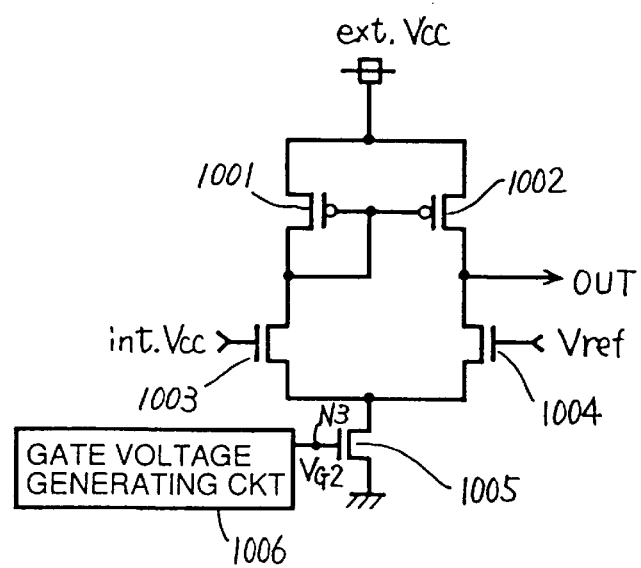
FIG. 6 is a schematic diagram showing a differential amplifier in the VDC circuit for peripherals.

Referring to FIG. 6, differential amplifier 100 of FIG. 2 includes PMOS transistors 1001 and 1002, and NMOS transistors 1003 to 1005, ahd a gate voltage generating circuit 1006.

PMOS transistors 1001 and 1002 have their source electrodes connected to an external power supply node, and gate electrodes connected to each other. NMOS transistor 1003 has its drain electrode connected to the drain electrode of PMOS transistor 1001, and receiving at its gate electrode int.Vcc. PMOS transistor 1002 has its drain electrode connected to an output terminal (OUT). NMOS transistor 1004 has its drain electrode connected to the output terminal (OUT), and receives at its gate electrode the reference voltage Vref. NMOS transistors 1003 and 1004 have their source electrodes connected to the drain electrode of NMOS transistor 1005. NMOS transistor 1005 has its source electrode grounded and its gate electrode connected to gate voltage supplying circuit 1006.

Here, between the drain electrode of NMOS transistor 1005 and source electrodes of NMOS transistors 1003 and 1004, an NMOS transistor or the like operating as a switch may be inserted.

Figure 7:
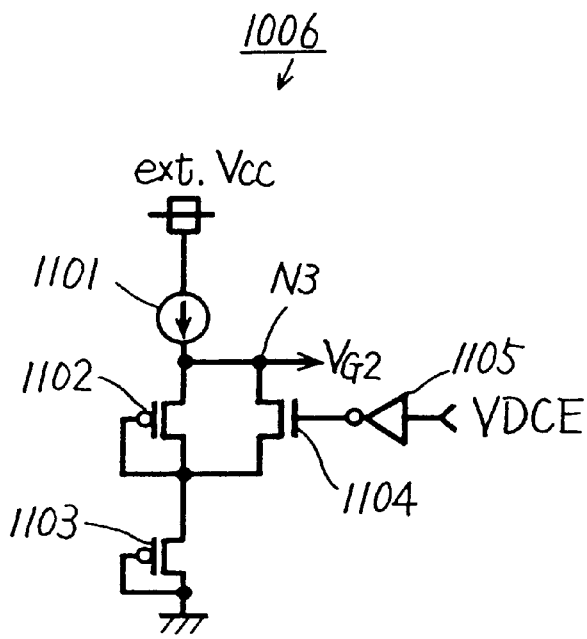
FIG. 7 is a schematic diagram showing a gate voltage generating circuit shown in FIG. 6.

The gate voltage supplying circuit 116 of FIG. 6 includes, referring to FIG. 7, a constant current source 1101, PMOS transistors 1102 and 1103, an NMOS transistor 1104, and an inverter 1105.

Between an external power supply node and the gate voltage supplying node N3, constant current source 1101 is connected. PMOS transistor 1102 has its source electrode connected to gate voltage supplying node N3, and its drain and gate electrodes connected to the source electrode of PMOS transistor 1103. PMOS transistor 1103 has its drain and gate electrodes grounded. NMOS transistor 1104 has its drain electrode connects to gate voltage supplying node N3, and its source electrode connected to drain and gate electrodes of PMOS transistor 1102. NMOS transistor 1104 has its gate electrode connected to an output node of inverter 1105. To the input node of inverter 1105, a voltage down converter enable signal (hereinafter referred to as a VDCE signal) is input from clock generating circuit 113.

The VDCE signal mentioned above is a control signal for increasing the supplying capability of VDC circuit 117 for peripherals, when the column system is operated, for example, which means that the power consumption in increased.

The circuit for generating the VDCE signal will be described. The clock generating circuit 1103 shown in FIG. 1 includes a CAT (Column Address Transition) signal generating circuit 500 shown in FIG. 8, an ATD (Address Transition Detection) signal generating circuit 600 shown in FIG. 9, an ATDN (Address Transition Detection Normal) signal generating circuit 700 and a CDE (Column Decoder Enable) signal generating circuit 800.

Figure 8:
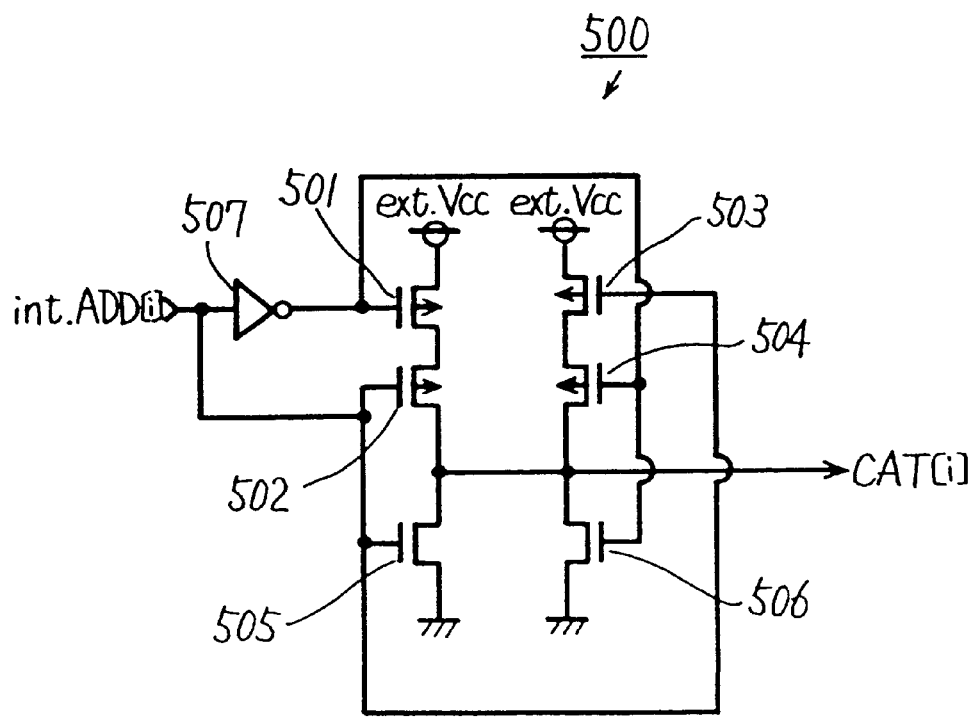
FIG. 8 is a schematic diagram showing a CAT signal generating circuit.

Referring to FIG. 8, CAT signal generating circuit 500 includes PMOS transistors 501 to 504, NMOS transistors 505 and 506, and an inverter 507.

CAT signal generating circuit 500 is provided corresponding to each bit of the address signal. Therefore, in case of an n bit address signal, n CAT signal generating circuits are provided. When i-th bit ADD[i] of the address signal is input, i-th bit CAT[i] of the CAT signal is generated, based on ext.Vcc.

Figure 9:
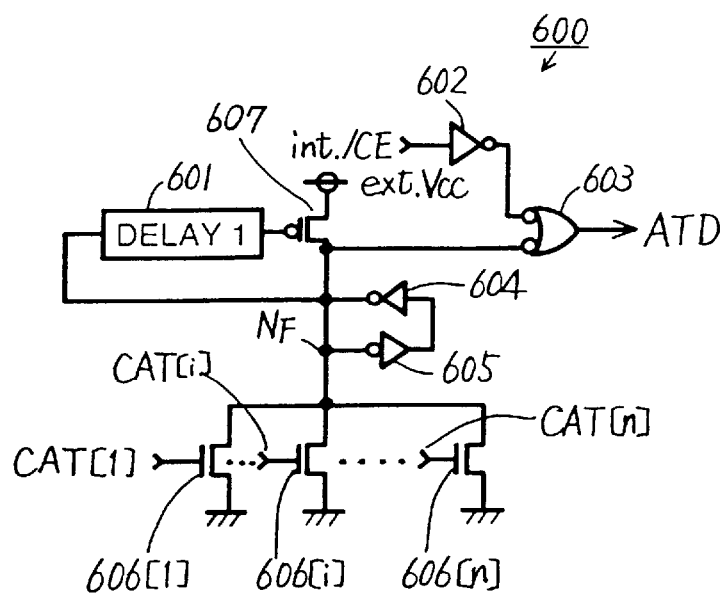
FIG. 9 is a schematic diagram showing an ATD signal generating circuit.

Referring to FIG. 9, ACT signal generating circuit 600 includes a delay circuit 601, inverters 602, 604 and 605, a negative logic NAND circuit 603, nNMOS transistors 606[i] (i=1 to n), and a PMOS transistor 607.

In ATD signal generating circuit 600, NMOS transistor 606([i] is provided corresponding to each bit (n bit in this example) of the address signal, and is turned on/off in response to the CAT[i] signal from CAT signal generating circuit 500 of FIG. 8. When address transition is detected with an internal chip enable signal (hereinafter referred to as int./CE) being at an L (logic low) level, an ATD signal having a short pulse width is generated.

Figure 10:
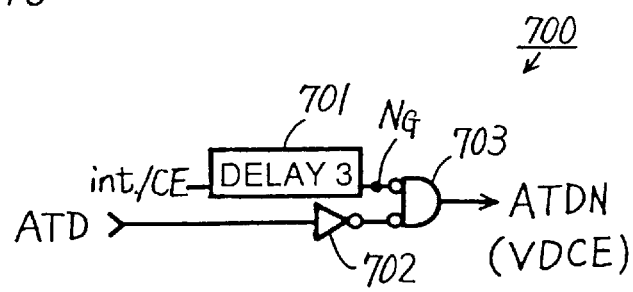
FIG. 10 is a schematic diagram showing an ACT signal generating circuit.

Referring to FIG. 10, ATDN signal generating circuit 700 includes a delay circuit 701, an inverter 702, and a negative logic NOR circuit 703.

ATDN signal generating circuit 700 generates, when int./CE is at the L level, an ADTN signal having a prescribed pulse width in response to the ATD signal from ATD signal generating circuit 600.

Figure 11:
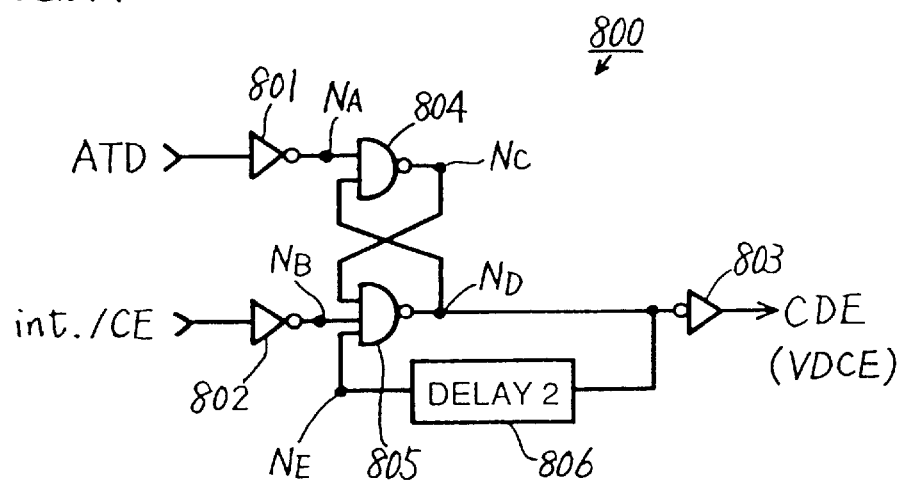
FIG. 11 is a schematic diagram showing a CDE signal generating circuit.

Referring to FIG. 11, CDE signal generating circuit 800 includes inverters 801 to 803, NAND circuits 804 and 805, and a delay circuit 806.

CED signal generating circuit 800 generates, when int./CE is at the L level, a CDE signal for activating column decoder 108, in response to the ATDN signal from ATDN signal generating circuit 600 shown in FIG. 9.

The ATDN signal generated by ATDN signal generating circuit 700 shown in FIG. 9 or the CDE signal generated by CDE signal generating circuit 800 of FIG. 11 is used as the VDCE signal.

Referring to the timing chart of FIG. 12, the operation of the circuit for generating the VDCE signal shown in FIGS. 8 to 10 will be described.

When int./RAS is activated to the L level, int./CE is activated to the L level. Consequently, the ATDN signal generating circuit 700 shown in FIG. 10 causes the ATDN signal, which has been at the H (logic high) level in non-operation to fall to the L level. Thereafter, at every address transition, an ATD signal having a pulse width (generally about 5 nsec) determined by delay circuit 601 is generated. The voltage at a node $N_F$ in ATD signal generating circuit 600 changes as shown in FIG. 12. More specifically, at node $N_F$, an L level pulse signal is generated in response to the CAT signal, and the pulse width thereof (delay1; generally about 5 nsec) is determined by the delay circuit 601.

The ATDN signal generating circuit 700 of FIG. 10 activates the ATDN signal to the H level when peripheral circuitry including column decoder 108 are activated. The ATDN signal is used as a VDCE signal. The voltage at node $N_G$ in ATDN signal generating circuit 700 changes as shown in FIG. 12. The input int./CE is delayed by delay circuit 701 and applied to negative logic NOR circuit 703. By the signal at the H level of node $N_G$, the initial H level portion of ATD signal is eliminated, thus ATDN signal is generated.

Figure 12:
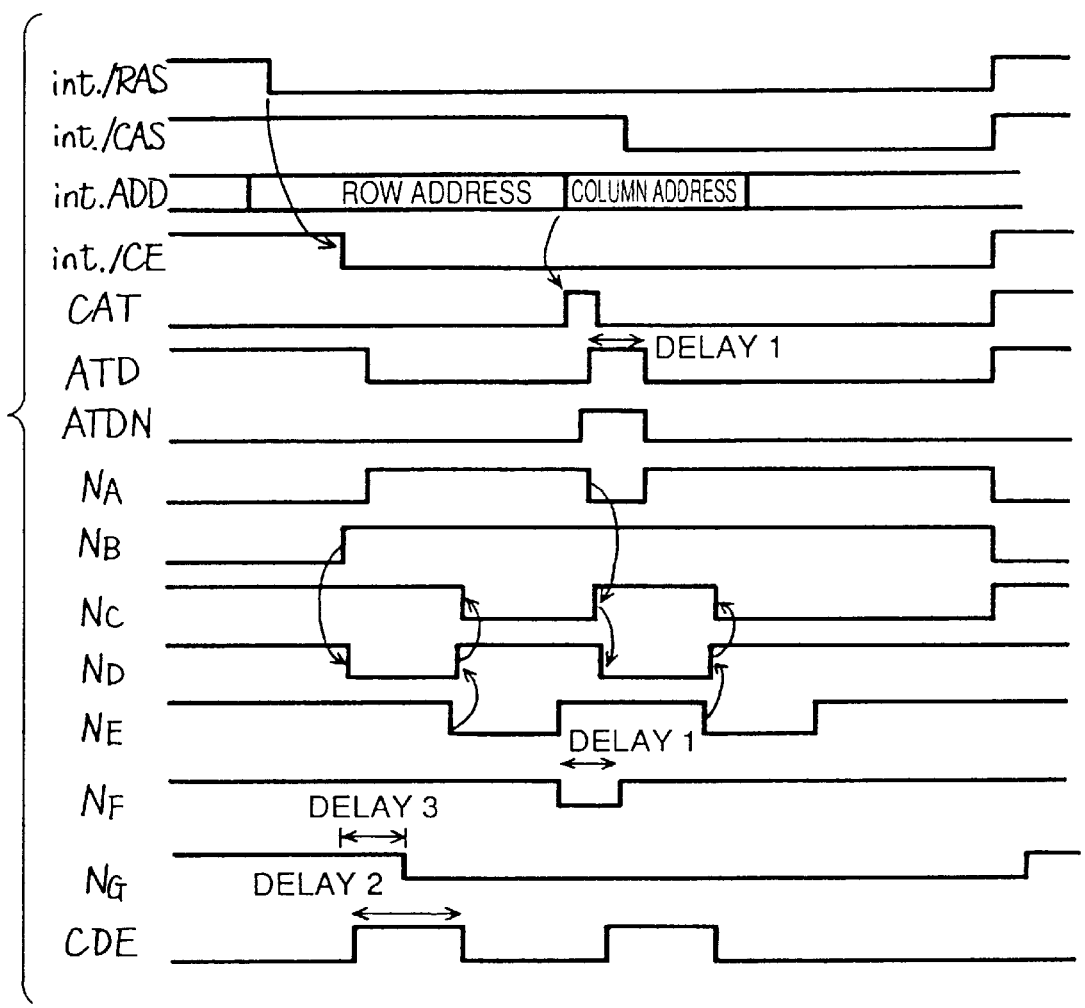
FIG. 12 is a timing chart showing generation of a VDCE signal.

The voltages at nodes $N_A$, $N_B$, $N_C$, $N_D$ and $N_E$ of CDE signal generated circuit 800 of FIG. 11 change as shown in FIG. 12. More specifically, at node $N_A$, a signal obtained by inverting ATD signal by inverter 801 is generated. At node $N_B$, a signal obtained by inverting int./CE by inverter 802 is generated. At node $N_E$, a signal obtained by delaying the signal at node $N_D$ by delay circuit 806 is generated. AT node $N_D$, a signal obtained by logic operation of signals at nodes $N_A$, $N_E$, and $N_B$ by AND circuits 804 and 805 is generated. The CDE signal is obtained by inverting the signal at node $N_D$ by inverter 803.

Therefore, when int./CE attains to the L level and the peripheral circuit including column decoder 108 are activated, the CDE signal having the pulse width (delay2; generally about 15 ns) determined by delay circuit 806 is generated, and thereafter, at every address transition, signal CDE signal is generated.

By using the ATDN signal or the CED signal generated in the above described manner as the VDCE signal, in the data voltage generating circuit 1006 of FIG. 7, when the peripheral circuits including decoder 108 are not in operation, the VDCE signal at the L level is input to inverter 1105. Consequently, NMOS transistor 1104 turns on, and gate voltage supplying node N3 is short-circuited to the source electrode of PMOS transistor 1103. Therefore, the gate voltage $V_{G2}$ supplied from gate voltage supplying node N3 becomes higher then the ground voltage by the threshold voltage Vthp of PMOS transistor 1103.

Meanwhile, when the peripheral circuits including column decoder 108 are in operation, the signal at the H level is input to inverter 1005. Therefore, NMOS transistor 1104 turns on, and the gate voltage $V_{G2}$ supplied from gate voltage supplying node N3 becomes higher than the ground voltage by the threshold voltage 2×Vthp of two PMOS transistors 1102 and 1103. Therefore, the gate voltage $V_{G2}$ when the column decoder 108 is in operation is higher than that when the column decoder 108 is not in operation.

In this manner, when column decoder 108 is in operation, the gate voltage $V_{G2}$ supplied from gate voltage supplying node N3 becomes higher and hence the gain of the differential amplifier 1000 shown in FIG. 6 increases only when the column decoder 108 is in operation.

Therefore, when the peripheral circuits including column decoder 108 are in operation, meaning that the power consumption is large, the VDC circuit 117 for peripherals can supply higher power stably, than when the peripheral circuits are not in operation.

(2) Second Embodiment

Figure 13:
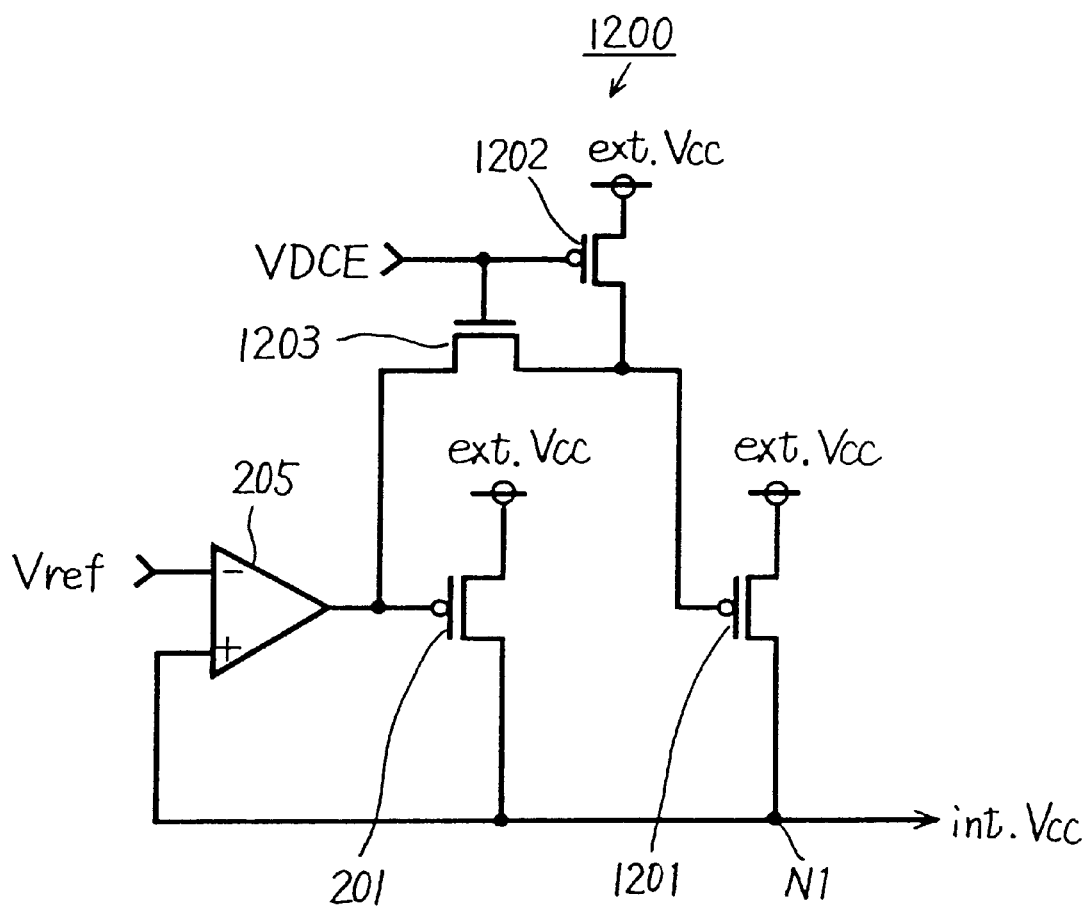
FIG. 13 is a schematic diagram showing the VDC circuit for peripherals in a semiconductor memory device in accordance with a second embodiment of the present invention.

Referring to FIG. 13, a VDC circuit 1200 for peripherals in the semiconductor memory device in accordance with the second embodiment of the present invention includes an output node N1, PMOS transistors 201, 1201, 1202, an NMOS transistor 1203 and a differential amplifier 205.

Driver transistor 201 has its source electrode connected to an external power supply node, and its drain electrode connected to output node N1. Driver transistor 1201 formed of a PMOS transistor has its source electrode connected to the external power supply node, and its drain electrode connected to output node N1. An inverted input terminal of differential amplifier 205 receives the reference voltage Vref, an non-inverted input terminal is connected to output node N1, and the output terminal is connected to the gate electrode of driver transistor 1201. PMOS transistor 1202 has its gate electrode connected to the external power supply node, its drain electrode connected to the gate electrode of driver transistor 1201, and receives at its gate electrode the VDCE signal. NMOS transistor 1203 has its source electrode connected to the gate electrode of driver transistor 1201, its drain electrode connected to the output terminal of differential amplifier 205, and receiving at its gate electrode the VDCE signal.

The ATDN or DCE signal shown in FIG. 12 is used as the VDCE signal. When peripheral circuits including column decoder 108 are not in operation, the VDCE signal attains to the L level. Consequently, NMOS transistor 1203 turns on, and the output terminal of differential amplifier 205 is disconnected from the gate electrode of driver transistor 1201. At this time, PMOS transistor 1202 turns on, and ext.Vcc is applied to the gate electrode of driver transistor 1201 from the external power supply node. Consequently, driver transistor 1201 is fully turned off.

As a result, only the driver transistor 1201 and the differential amplifier 205 operate. As a result, supplying capability of int.Vcc decreases, and smaller power is supplied.

Meanwhile, when the peripheral circuits including column decoder 108 are in operation, the VDCE signal attains to the H level. Accordingly, NMOS transistor 1203 turns on, and the output terminal of differential amplifier 205 is connected to the gate electrode of driver transistor 1201. At this time, the PMOS transistor 1202 turns on. Accordingly, ext.Vcc is not applied from the external power supply node to the gate electrode of driver transistor 1201. Accordingly, conduction state of driver 1201 is controlled in response to the voltage at the output terminal of differential amplifier 205. More specifically, similar to driver transistor 201, driver transistor 1201 generates int.Vcc at output node N1 based on ext.Vcc, such that int.Vcc becomes equal to the reference voltage Vref.

Figure 27:
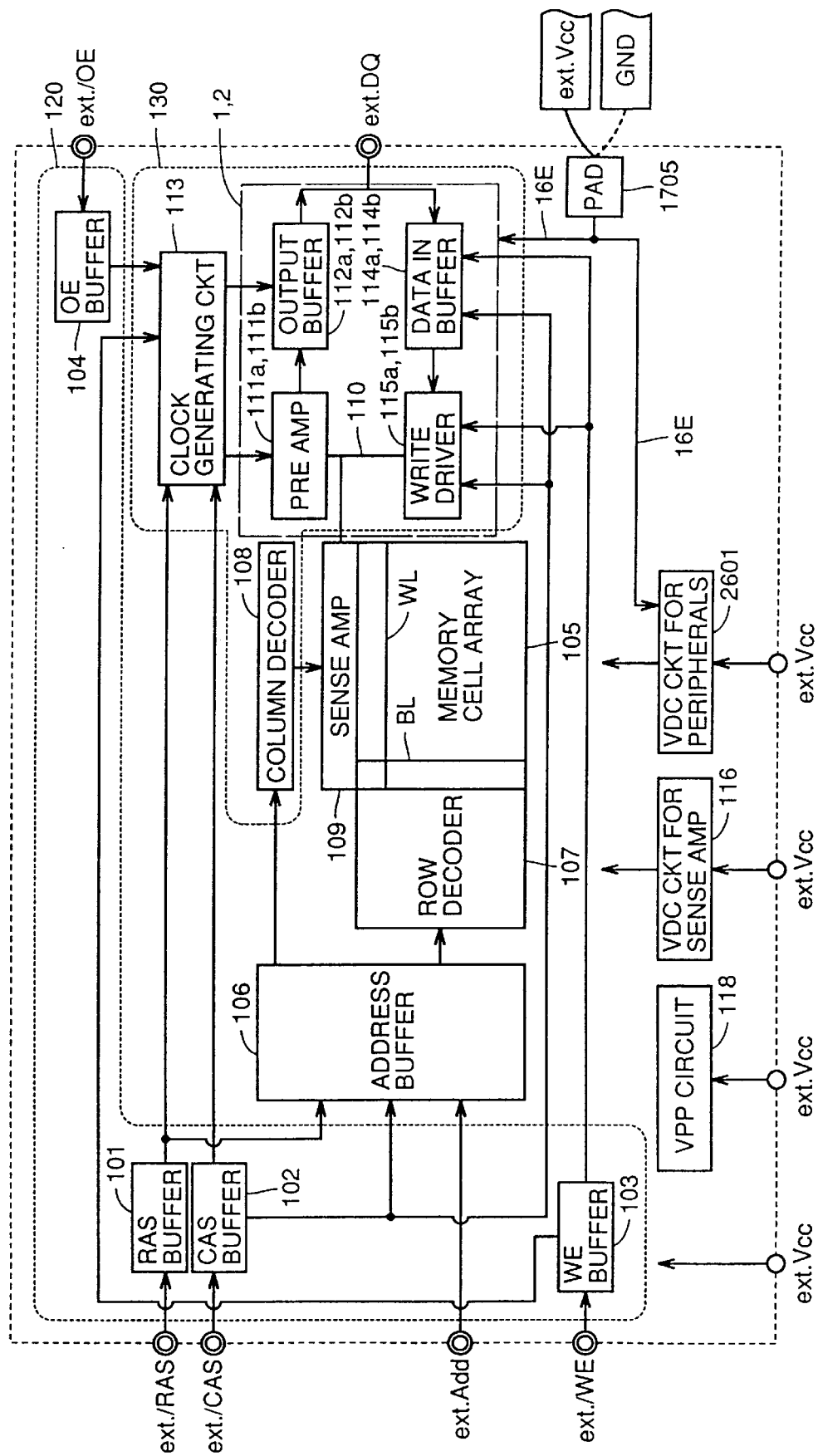
FIG. 27 is a block diagram showing another example of the conventional semiconductor memory device.

Therefore, as compared with the conventional VDC circuit 2601 for peripherals shown in FIG. 27, in VDC circuit 1200 for peripherals, the int.Vcc supplying capability is increased by driver transistor 1201, and it can supply large power only when the peripheral circuits including column decoder 108, which consumes much power, are in operation.

Driver transistor 1201 shown in FIG. 13 may be omitted. However, in order to completely turn off driver transistor 1201, provision of transistor 1202 is preferable.

When differential amplifier 205 is replaced by differential amplifier 1000 shown in FIG. 6, the supplying capability can further be improved.

(3) Third Embodiment

Figure 14:
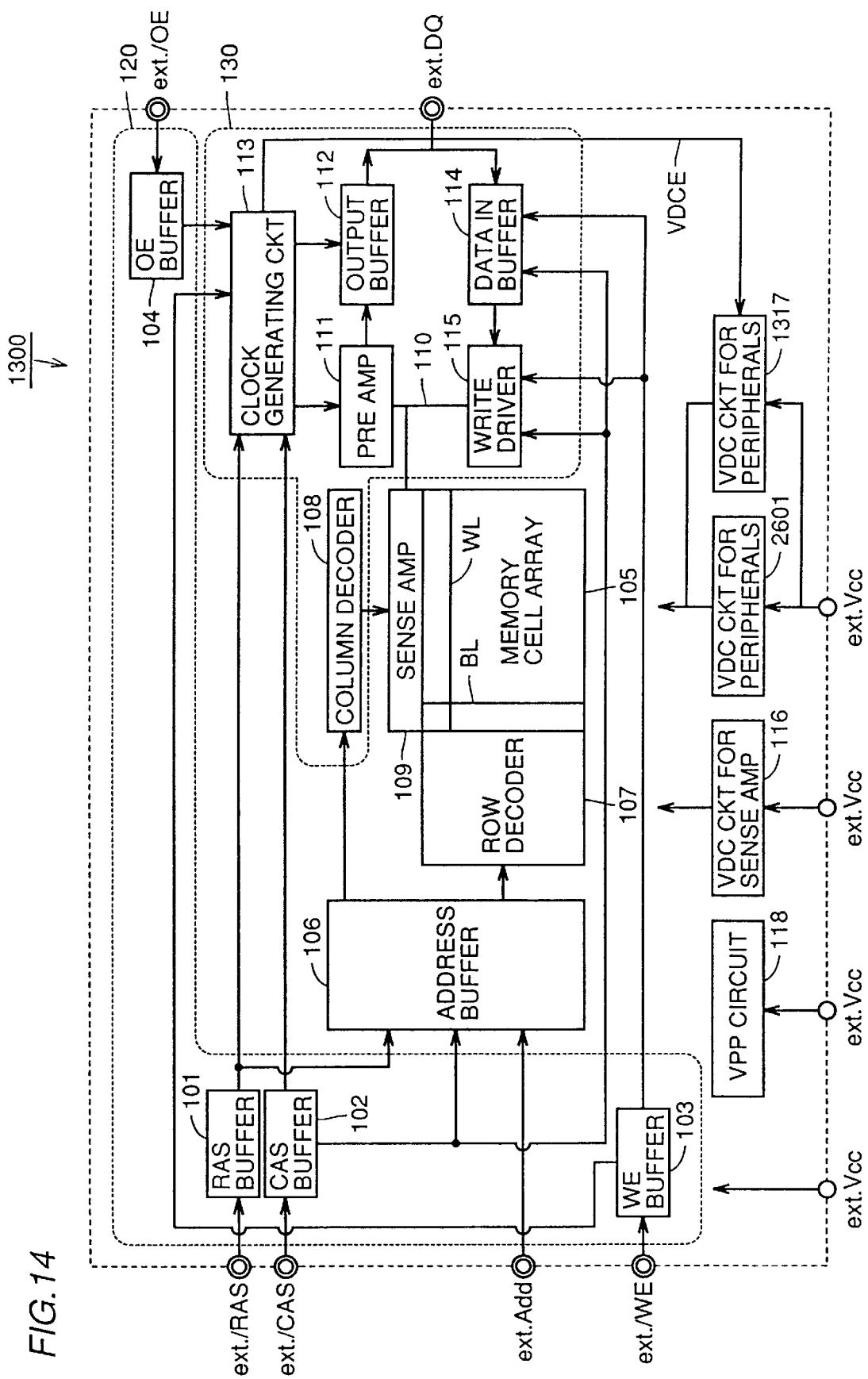
FIG. 14 is a block diagram showing a structure of a semiconductor memory device in accordance with a third embodiment of the present invention.

Referring to FIG. 14, semiconductor memory device 1300 in accordance with the third embodiment of the present invention includes, in place of the VDC circuit 117 for peripherals shown in FIG. 1, a VDC circuit 2601 for peripherals and a VDC circuit 1317 for peripherals.

Figure 26:
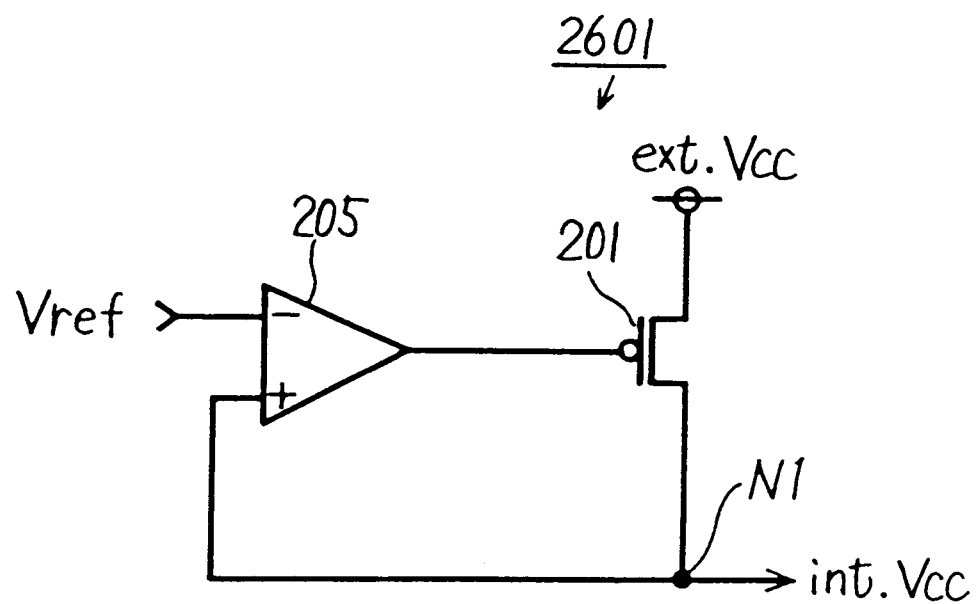
FIG. 26 is a schematic diagram showing a VDC circuit for peripherals shown in FIG. 25.

Referring to FIG. 26, VDC circuit 2601 for peripherals includes an output node N1 for outputting int.Vcc, a driver transistor 201 and a differential amplifier 205.

In VDC circuit 2601 for peripherals, driver transistor 201 has its source electrode connected to an external power supply node, its drain electrode connected to a non-inverted input terminal (+) of differential amplifier 205 as well as to output node N1, and its gate electrode connected to an output terminal of differential amplifier 205. The inverted input terminal (−) of differential amplifier 205 receives the reference voltage Vref.

In VDC circuit 2601 for peripherals, the voltage int.Vcc at output node N1 is compared with reference voltage Vref, and gate voltage of driver transistor 201 is controlled such that int.Vcc becomes equal to Vref. Consequently, int.Vcc is generated based on ext.Vcc. VDC circuit 2601 for peripherals is connected to peripherals circuits other than input initial stage 120, output buffer 112 and sense amplifier 109, in semiconductor memory device 1300. Therefore, VDC circuit 2601 for peripherals supplies int.Vcc to the aforementioned peripheral circuits when the semiconductor memory device 1300 is active.

Meanwhile, VDC circuit 1317 for peripherals is connected to peripheral circuits including column decoder 108, and is activated when peripheral circuits including column decoder 108 in operation. Therefore, VDC circuit 1317 for peripherals supplies int.Vcc to the aforementioned peripheral circuits when column decoder 108 is in operation. VDC circuit 1317 for peripherals is connected to receive the VDCE signal from clock generating circuit 113.

Since other circuit structures and connection therebetween of semiconductor memory device 1300 are similar to those of semiconductor memory device 100 shown in FIG. 1, description thereof is not repeated.

Figure 15:
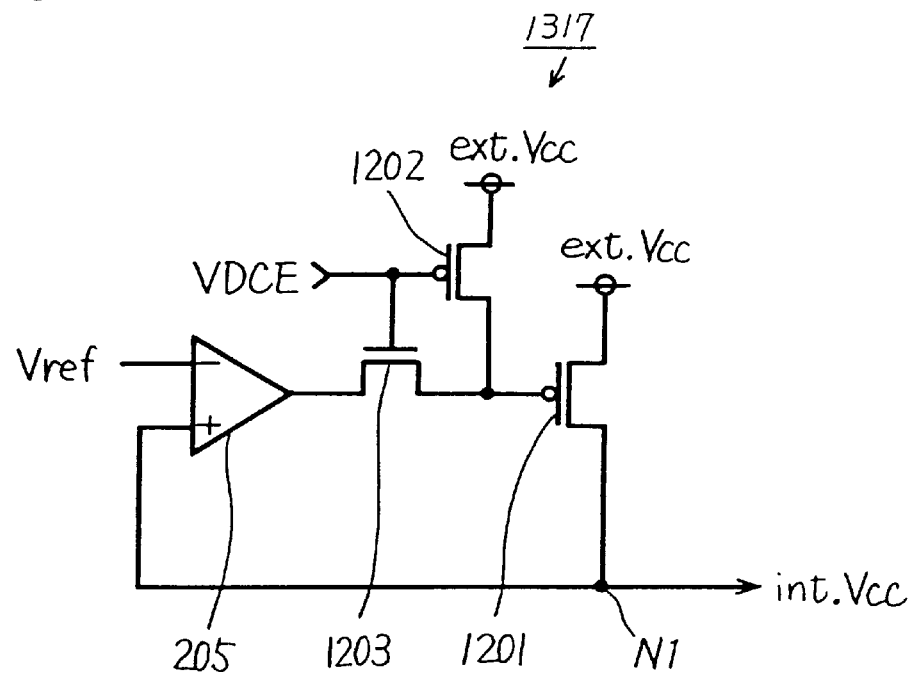
FIG. 15 is a schematic diagram showing the VDC circuit for peripherals shown in FIG. 14.

Referring to FIG. 15, the VDC circuit 1317 of FIG. 14 includes PMOS transistors 1201 and 1202, an NMOS transistor 1203, and a differential amplifier 205.

The inverted input terminal of differential amplifier 205 receives reference voltage Vref, and non-inverted terminal is connected to node N1. Driver transistor 1201 has its source electrode connected to an external power supply node, its drain electrode connected output node N1, and its gate electrode connected to the output terminal of differential amplifier 205. PMOS transistor 1202 has its source electrode connected to the external power supply node, drain electrode connected to the gate electrode of driver transistor 1201, and it receives at its gate electrode the VDCE signal. NMOS transistor 1203 has its source electrode connected to the gate electrode of driver transistor 1201, its drain electrode connected to the output terminal of differential amplifier 205, and it receives at its gate electrode the VDC signal.

In the VDC circuit 1317 for peripherals, when peripheral circuits including column decoder 108 are not in operation, the VDCE signal attains to the L level. Therefore, NMOS transistor 103 turns off, and the output terminal of differential amplifier 205 is disconnected from the gate electrode of driver transistor 1201. At this time, PMOS transistor 1202 turns on and ext.Vcc is applied from the external power supply node to the gate electrode of driver transistor 201. Consequently, driver transistor 201 is fully turned of.

Meanwhile, when peripheral circuits including column decoder 108 are in operation, the VDCE signal attains to the H level, NMOS transistor 1203 turns on, and the output terminal of differential amplifier 205 is connected to the gate electrode of driver transistor 1201. At this time, since PMOS transistor 1202 turns off, ext.Vcc is not supplied from the external power supply node to the gate electrode of driver transistor 1201. Therefore, in response to the output voltage from differential amplifier 205, the conduction state of driver transistor 1201 is controlled. In other words, driver transistor 1201 is activated only when the peripheral circuits including column decoder 108 are in operation, and it supplies int.Vcc to the peripheral circuits.

Therefore, when the peripheral circuits including the column decoder are in operation, that is, when power consumption increases, the supplying capability of int.Vcc improves, and hence a large power can be supplied stably.

Figure 16:
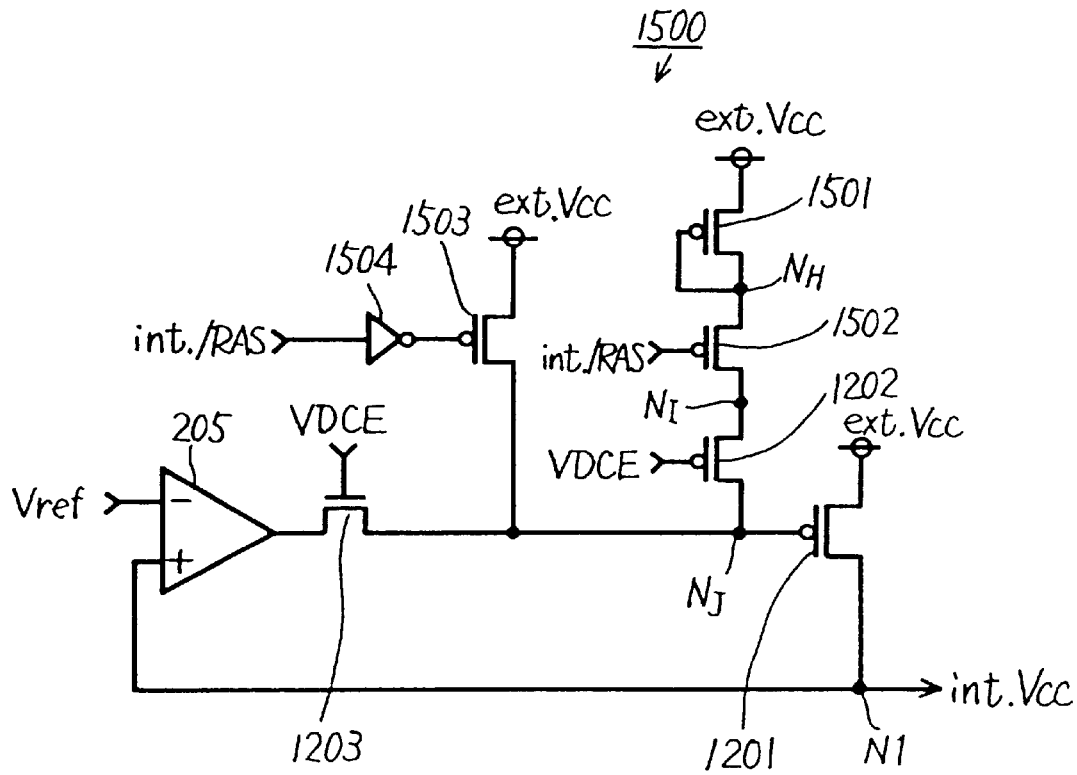
FIG. 16 is a schematic diagram showing an example of improvement of the VDC circuit for peripherals shown in FIG. 15.

The VDC circuit 1500 for peripherals shown in FIG. 16 may be used instead of the VDC circuit 1317 for peripherals shown in FIG. 15. Referring to FIG. 16, the VDC circuit 1500 for peripherals includes, in addition to the VDC circuit 1317 for peripherals shown in FIG. 15, PMOS transistors 1501 to 1503 and an inverter 1504.

PMOS transistor 1501 has its source electrode connected to the external power supply node, and its drain and gate electrodes connected at node $N_H$ to the source electrode of PMOS transistor 1502. PMOS transistor 1502 has its drain electrode connected at precharge node $N_I$ to the source electrode of PMOS transistor 1202, and at its gate electrode, it receives int./RAS. PMOS transistor 1503 has its source electrode connected to the external power supply node, drain electrode connected at a node $N_I$ to the gate electrode of driver transistor 1201, and its gate electrode connected to the output node of inverter 1504. Inverter 1504 receives at its input node int./RAS.

Figure 17:
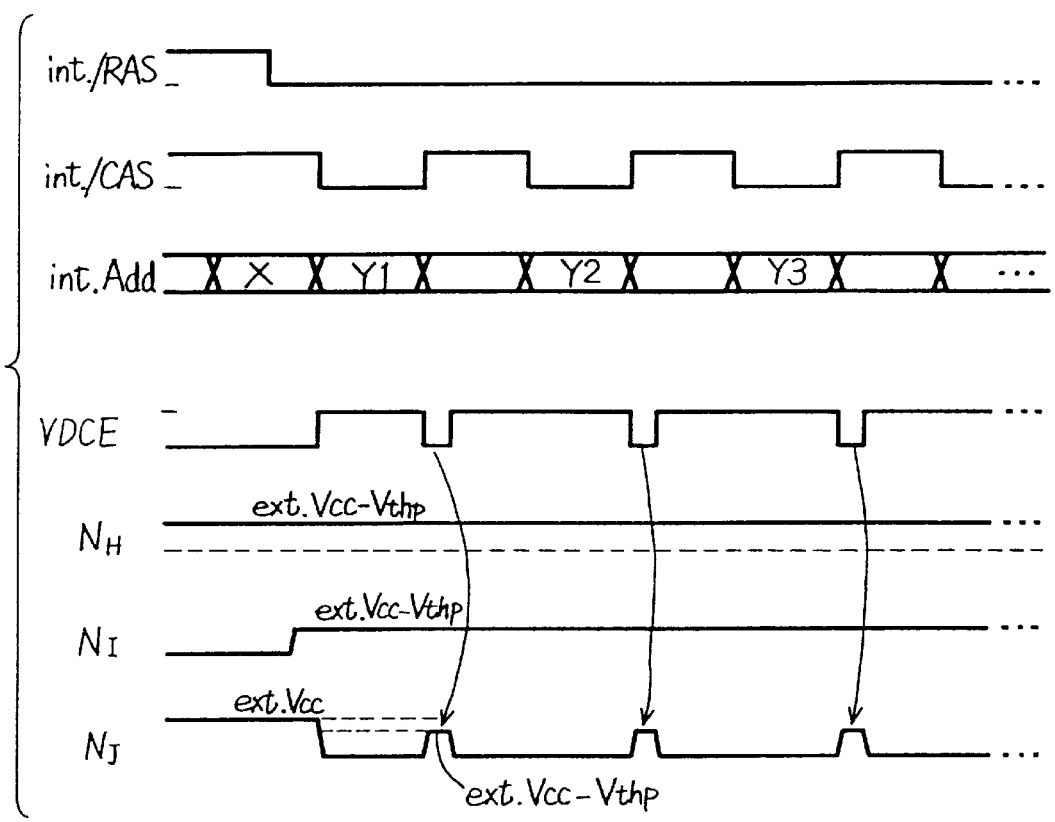
FIG. 17 is a timing chart showing the operation of the VDC circuit for peripherals shown in FIG. 16.

Referring to the timing chart of FIG. 17, the operation of the VDC circuit 1500 for peripherals shown in FIG. 16 will be described.

At the time of standby, int./RAS is at the H level, and hence PMOS transistor 1503 is on. Consequently, ext.Vcc is supplied to the gate electrode of driver transistor 1201 from its external power supply node, and the other transistor 1201 is on. Therefore, int.Vcc is not supplied to output node N1. Further, since there is no leak current, power is not wasted.

On the other hand, at active state, int./RAS attains to the L level, and PMOS transistor 1503 turns off. Since PMOS transistor 1502 turns on, the voltage at nodes $N_H$ and $N_I$ attains (ext.Vcc−Vthp). Here, Vthp represents threshold voltage of PMOS transistor 1501.

Here, when the peripheral circuits including column decoder 108 are not in operation, the VDCE signal attains to the L level, so that NMOS transistor 1203 turns off and the output terminal of differential amplifier 205 is disconnected from the gate electrode of driver transistor 1201. At this time, PMOS transistor 1202 turns on, and the voltage (ext.Vcc−Vthp) at precharge node $N_I$ is applied to the gate electrode of driver transistor 1201.

Generally, the column address changes in quite a short period. However, by precharging the voltage of precharge node $N_I$ to an intermediate potential between ext.Vcc and the ground voltage, it becomes possible to fully and quickly turn on/off the driver transistor 1201. Therefore, int.Vcc can be supplied to the peripheral circuits smoothly following the transition of the column address.

For VDC circuits 1317 and 1500 for peripherals, the gate voltage supplying circuit 209 shown in FIG. 4 and gate voltage generating circuit 1006 of FIG. 7 may be sued. In that case, similar effects as in the first embodiment, can be obtained. Further, the VDCE signal similar to that of the first embodiment may be used.

(4) Fourth Embodiment

Figure 18:
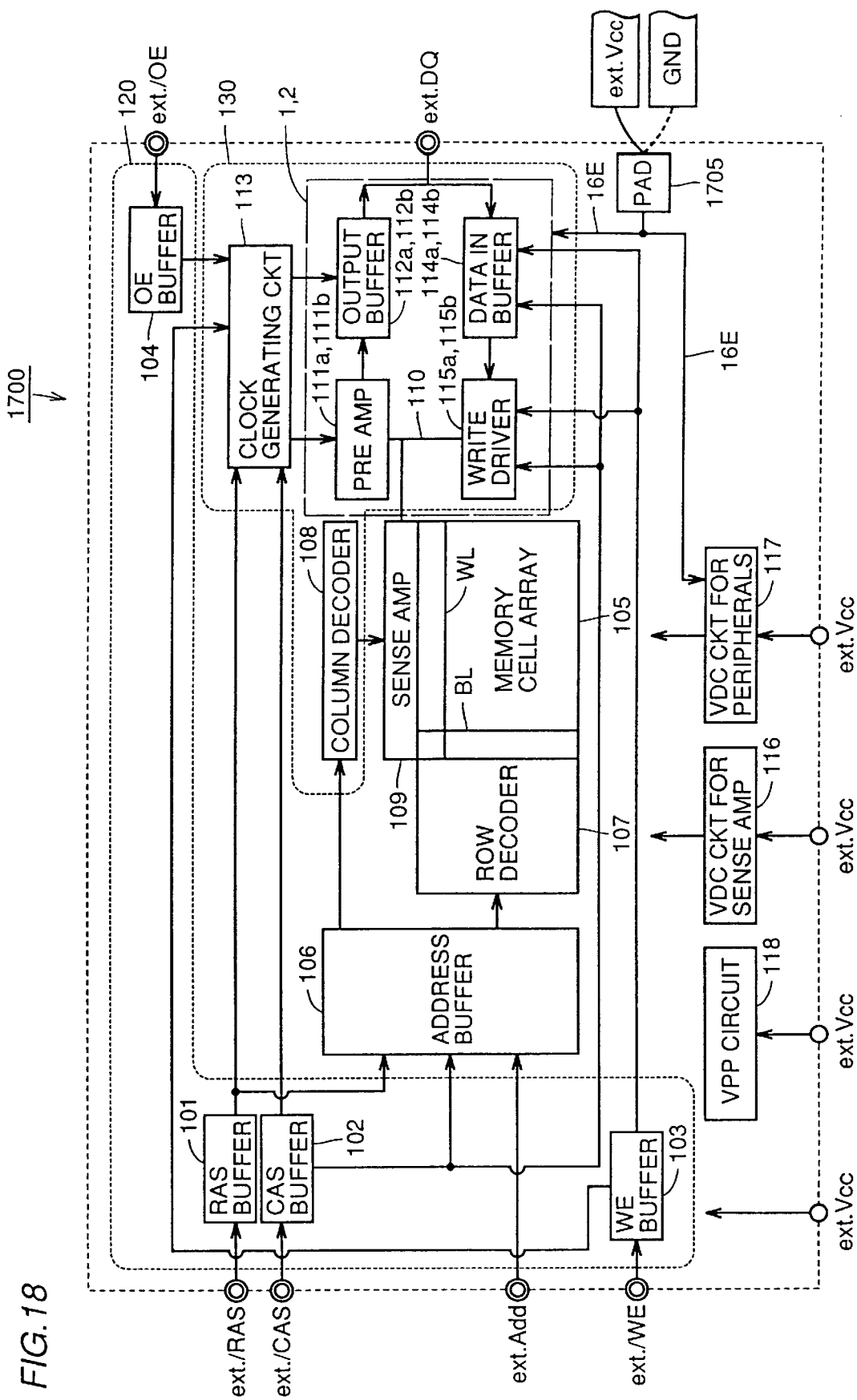
FIG. 18 is a block diagram showing a structure of the semiconductor memory device in accordance with a fourth embodiment of the present invention.

Referring to FIG. 18, the semiconductor memory device 1700 in accordance with a fourth embodiment of the present invention includes, instead of preamplifier 111, output buffer 112, data in buffer 114 and write driver 115 shown in FIG. 1, input/output circuits 1 and 2 including preamplifiers 111a and 111b, output buffers 112a and 112b, data in buffers 114a and 114b, and write drivers 115a and 115b. The semiconductor memory device 1700 further includes an ext.DQ pin connected to input/output circuits 1 and 2, and a pad 1705 connected to input/output circuits 1 and 2 as well as to VDC circuit 117 for peripherals. The ext.Vcc or GND is selectively applied to pad 1705.

Other circuit structures and operation thereof of the semiconductor memory device 1700 in accordance with the fourth embodiment are similar to those of the semiconductor memory device 100 in accordance with the first embodiment. Therefore, description thereof is not repeated.

In the semiconductor memory device 1700, any of the word configurations including ×1, ×4, ×8 and ×16 may be selected. When ×8 word configuration is selected, for example, 8 bits of data are input/output in parallel in response to an applied one address. The word configuration is selected in response to an activating signal 16E generated based on the voltage applied to pad 1705.

Figure 19:
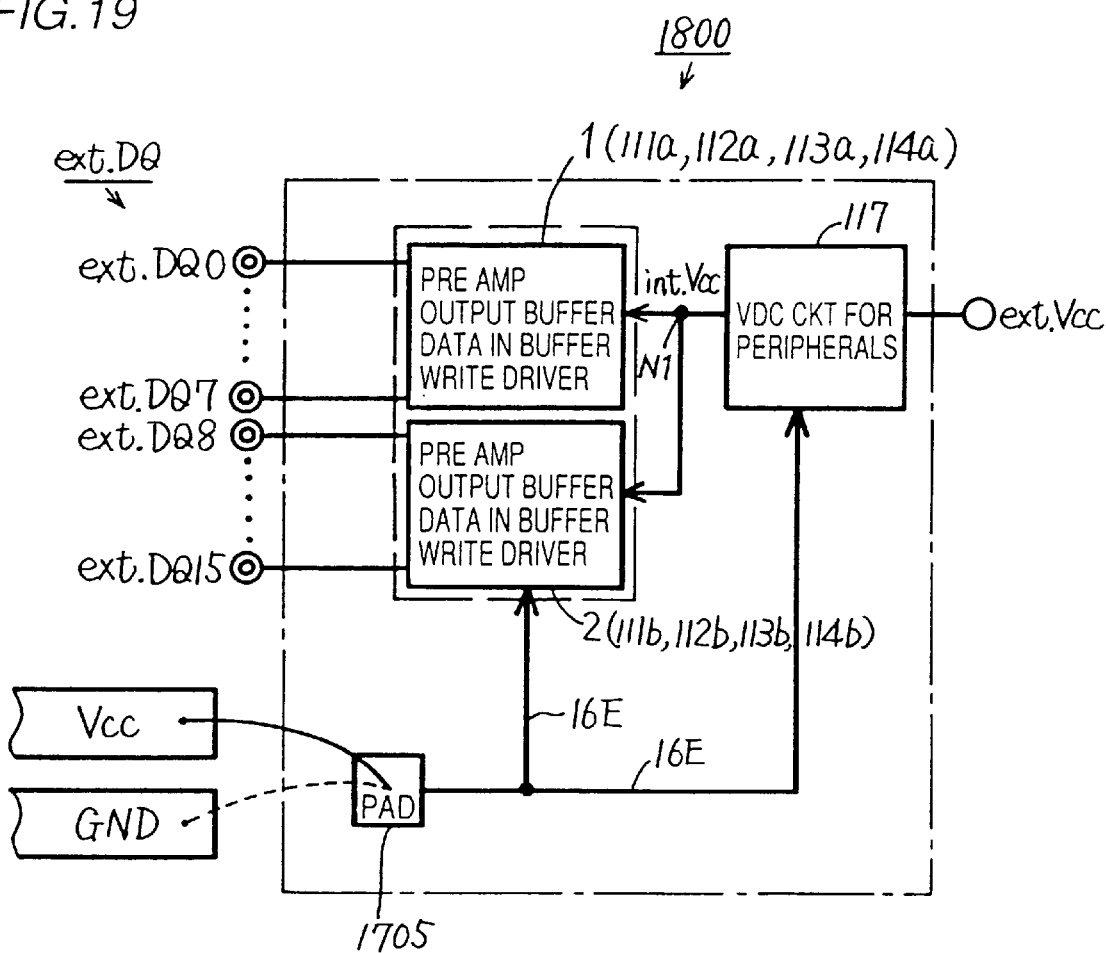
FIG. 19 is a block diagram showing a memory structure of the semiconductor memory device shown in FIG. 18.

Referring to FIG. 19, in a main portion 1800 of semiconductor memory device 1700 shown in FIG. 18, a structure allowing switching between ×8 word configuration and ×16 word configuration is shown as an example.

The main portion 1800 of semiconductor memory device 1700 includes the ext.DQ pin, the input/output circuit 1 which is normally activated in the active state (including preamplifier 111a, output buffer 112a, data in buffer 114a and write driver 115a), the input/output circuit 2 which is activated when ×16 word configuration is selected (including preamplifier 111b, output buffer 112b, data in buffer 114b and write driver 115b), the pad 1705 receiving either the ext.Vcc or the ground voltage (GND), and VDC circuit 117 for peripherals for supplying int.Vcc to input/output circuits 1 and 2.

Ext.DQ pin includes 16 external data input/output pins ext.DQ0 to ext.DQ15.

External data input/output pins ext.DQ0 to ext.DQ7 are connected to output buffer 112a and data in buffer 114a of input/output circuit 1. External data input/output pins ext.DQ8 to ext.DQ15 are connected to output buffer 112b and data in buffer 114b of input/output circuit 2.

Which of ×8 word configuration and ×16 word configuration is to be selected is determined by which of ext.Vcc and GND is connected to pad 1705.

When GND is connected, ×8 word configuration is selected. Meanwhile, when ext.Vcc is connected, ×16 word configuration is selected. When ext.Vcc is connected to pad 1705, input/output circuits 1 and 2 are activated, and a control signal (hereinafter referred to as signal 16E) for increasing int.Vcc supplying capability of VDC circuit 117 for peripherals is applied to VDC circuit 117 for peripherals.

VDC circuit 117 for peripherals is connected to input/output circuits 1 and 2. Pad 1705 receives either ext.Vcc or the ground voltage (GND) as described above, and is connected to input/output circuit 2 and VDC circuit 117 for peripherals.

The VDC circuit 117 for peripherals similar to that of the first embodiment may be utilized. However, instead of the VDCE signal, signal 16E is input.

Figure 20:
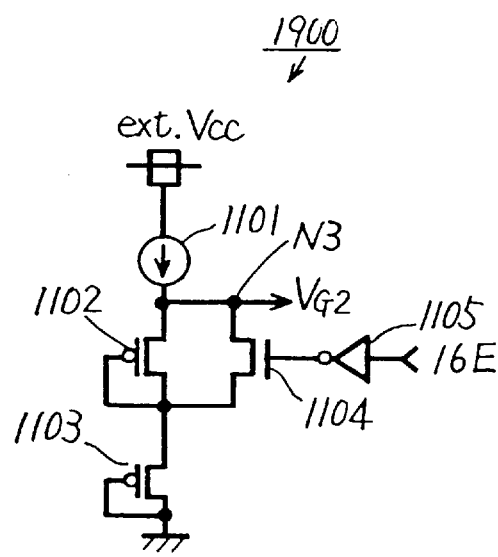
FIG. 20 is a schematic diagram showing a gate voltage supplying circuit in a differential amplifier in the VDC circuit for peripherals shown in FIG. 19.

Referring to FIG. 20, the gate voltage generating circuit 1900 in the differential amplifier of VDC circuit 117b for peripherals shown in FIG. 19 receives, instead of the VDCE signal for gate voltage generating circuit 1006 of FIG. 7, the signal 16E.

Consequently, similar effects as in the first embodiment can be obtained. Further, what is done is simply replacement of VDCE signal for gate voltage generating circuit 1006 of FIG. 7 by the signal 16E. Therefore, the VDC circuit 117 for peripherals can supply large power stably to both input/output circuits 1 and 2 when ×16 word configuration is selected.

(5) Fifth Embodiment

Figure 21:
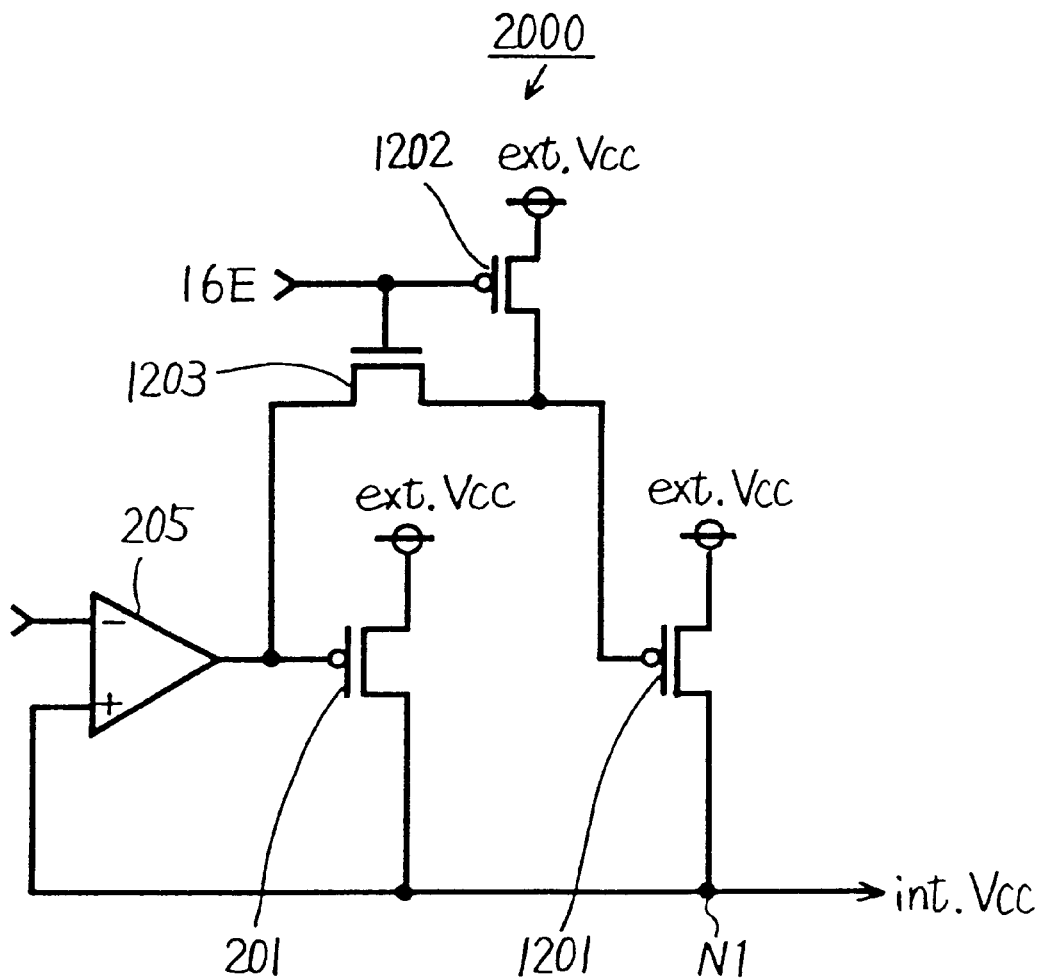
FIG. 21 is a schematic diagram showing the VDC circuit for peripherals in the semiconductor memory device in accordance with the fifth embodiment of the present invention.

Referring to FIG. 21, a VDC circuit 2000 for peripherals in the semiconductor memory device in accordance with a fifth embodiment of the present invention receives, instead of the VDCE signal for the VDC circuit 1200 for peripherals shown in FIG. 13, the signal 16E.

Consequently, VDC circuit 2000 for peripherals can supply large power stably to the input/output circuits 1 and 2 when ×16 word configuration, which consumes much power, is selected, similar to VDC circuit 117 for peripherals.

Since other circuit structures and operation of the fifth embodiment are the same as those of semiconductor memory device 100 in accordance with the first embodiment, description thereof not repeated.

(6) Sixth Embodiment

Figure 22:
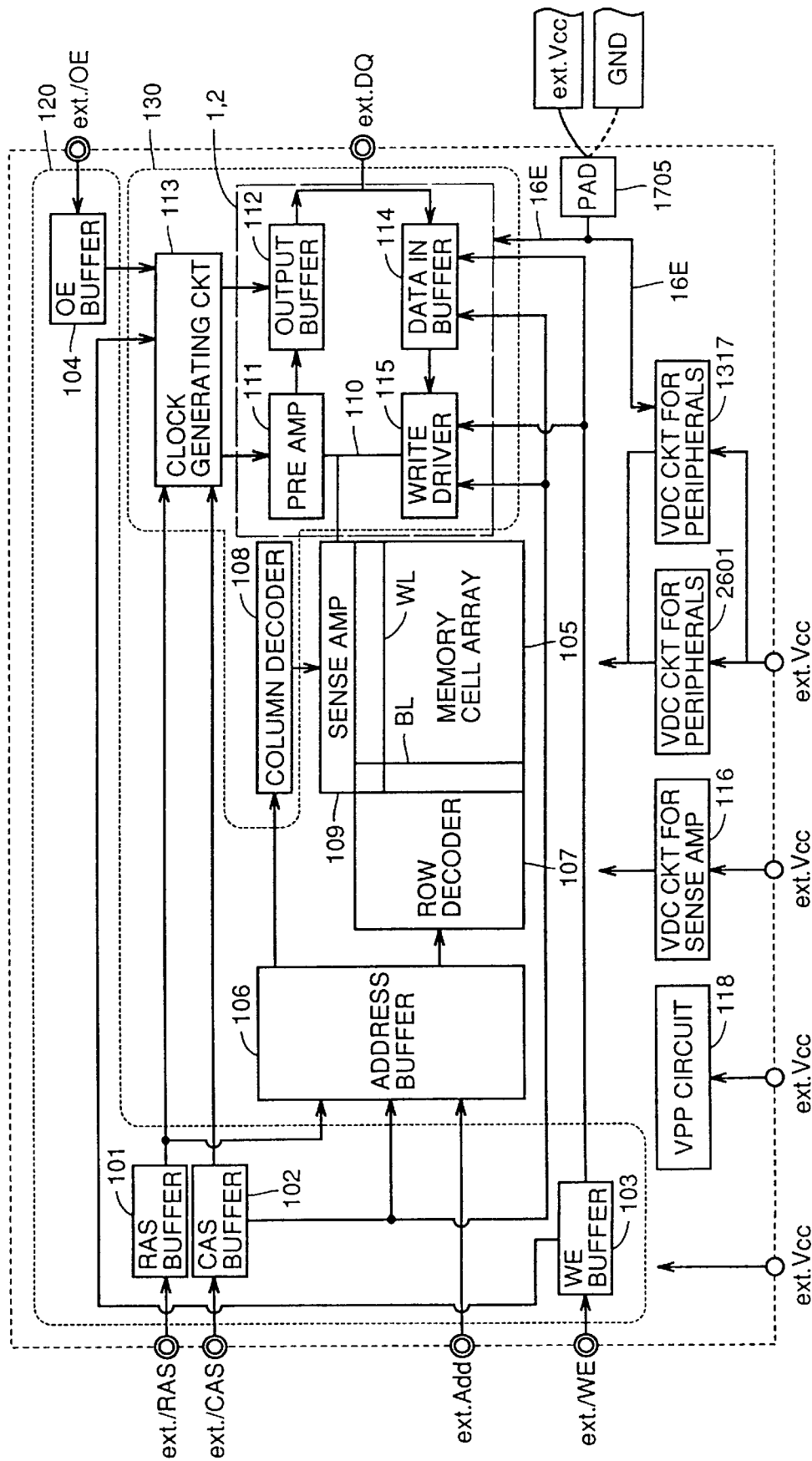
FIG. 22 is a block diagram showing a structure of a semiconductor memory device in accordance with a sixth embodiment of the present invention.

Referring to FIG. 22, the semiconductor memory device 2100 in accordance with a sixth embodiment of the present invention includes, instead of preamplifier 111, output buffer 112, data in buffer 114 and write driver 115 shown in FIG. 14, input/output circuits 1 and 2 including preamplifiers 111a and 111b, output buffers 112a and 112b, data in buffers 114a and 114b, and write drivers 115a and 115b. Semiconductor memory device 2100 further includes ext.DQ pin connected to input/output circuits 1 and 2, and pad 1705 connected to input/output circuits 1 and 2 as well as to VDC circuit 1317 for peripherals. Ext.Vcc or the GND is selectively applied to pad 1705.

Other circuit structures and operation thereof in a semiconductor memory device in accordance with the sixth embodiment are the same as those of semiconductor memory device 1300 in accordance with the third embodiment described above. Therefore, the description thereof is to repeated.

Figure 23:
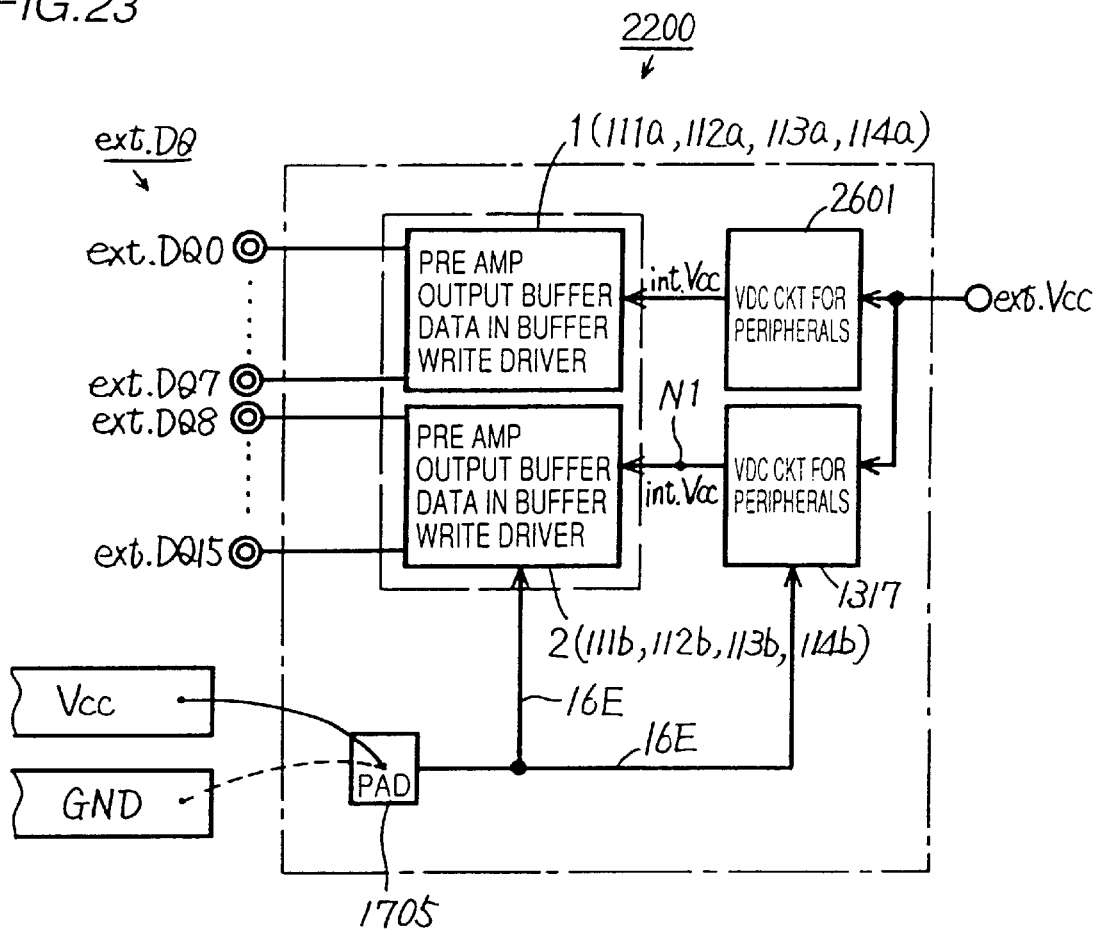
FIG. 23 is a block diagram showing a main structure of the semiconductor memory device shown in FIG. 22.

Referring to FIG. 23, a main portion 220 of semiconductor memory device 2100 shown in FIG. 22 includes the ext.DQ pin, input/output circuit 1 which is activated when the semiconductor memory device 2100 is in the active state, input/output circuit 2 which is activated only when ×16 word configuration is selected, VDC circuit 2601 for peripherals supplying int.Vcc to input/output circuit 1, VDC circuit 1317 for peripherals supplying int.Vcc to input/output circuit 2, and pad 1705 receiving either ext.Vcc or the ground potential (GND).

The ext.DQ pin includes external data input/output pins ext.DQ0 to ext.DQ15. External data input/output pins ext.DQ0 to ext.DQ7 are connected to output buffer 112a and data in buffer 114a of input/output circuit 1. External data input/output pins ext.DQ8 to ext.DQ15 are connected to output buffer 112b and data in buffer 115b of input/output circuit 2. When ×8 word configuration is selected, only the input/output circuit 1 is activated, and data input/output is performed through external data input/output pins ext.DQ0 to ext.DQ7 only. Meanwhile, when ×16 word configuration is selected, input/output circuit 2 is activated in addition to input/output circuit 1, and data input/output is performed through all of the external data input/output pins ext.DQ0 to ext.DQ15.

VDC circuit 2601 for peripherals is connected to input/output circuit 1. VDC circuit 1317 for peripherals is connected to input/output circuit 2. When GND is connected to pad 1705, ×8 word configuration is selected, and when ext.Vcc is connected to pad 1705, ×16 word configuration is selected, as in the third embodiment described above.

Pad 1705 is connected to input/output circuit 2 and VDC circuit 1317 for peripherals, and when ×16 word configuration is selected, it supplies the signal 16E to input/output circuit 2 and VDC circuit 1317 for peripherals, as in the above described embodiment.

When GND is connected pad 1705 and ×8 word configuration is selected, only input/output circuit 1 and VDC circuit 2601 for peripherals are activated, and data input/output is performed through only the external data input/output pins ext.DQ0 to ext.DQ7. At this time, VDC circuit 2601 for peripherals supplies int.VDQ to input/output circuit 1. Further, since VDC circuit 1317 for peripherals receives signal 16E at the L level, it does not supply int.Vcc to input/output circuit 2.

Meanwhile, since ext.Vcc is connected to pad 1705, when ×16 word configuration is selected, signal 16E is supplied from pad 1705 to input/output circuit 2 and VDC circuit 1317 for peripherals. Therefore, input/output circuit 2 and VDC circuit 1317 for peripherals are activated. Therefore, data input/output is performed through all of the external input/output pins ext.DQ0 to ext.DQ15. At this time, int.Vcc is supplied from VDC circuit 1317 for peripherals to input/output circuit 2.

Figure 24:
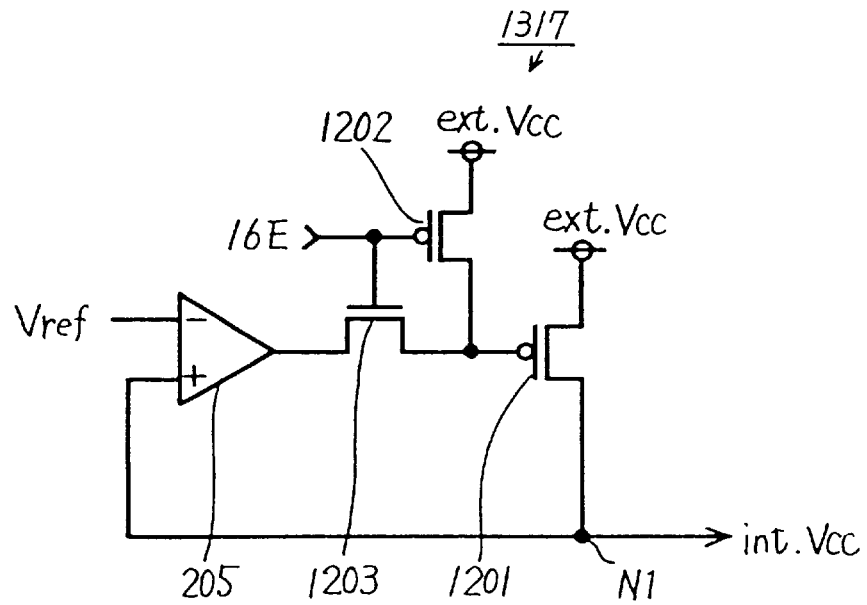
FIG. 24 is a schematic diagram showing the VDC circuit for peripherals to which a 16E signal of FIG. 22 is input.
Figure 25:
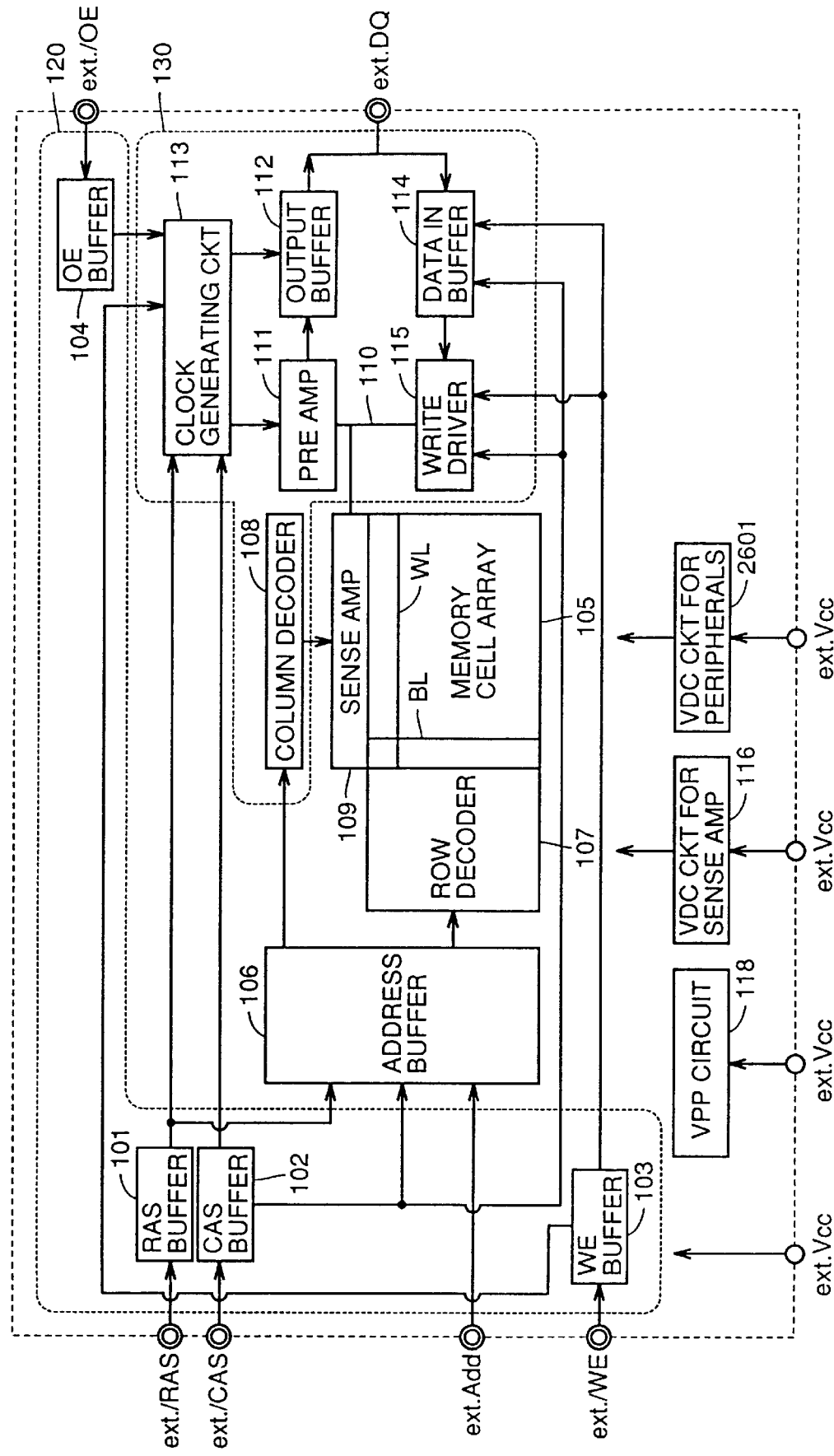
FIG. 25 is a block diagram showing an example of a conventional semiconductor memory device.

Referring to FIG. 24, VDC circuit 1307 for peripherals shown in FIG. 23 receives the signal 16E instead of the VDCE signal for VDC circuit 1317 for peripherals shown in FIG. 15. Consequently, int.Vcc is supplied from the VDC circuit 1317 for peripherals to the input/output circuit 2 only when ×16 word configuration is selected.

Therefore, even when power consumption increases as ×16 word configuration is selected, the increase in the power consumption can be made up for by the VDC circuit 1317 for peripherals.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a memory cell array including a plurality of memory cells arranged in rows and columns; and internal power supply means for generating an internal power supply voltage based on an external power supply voltage; wherein said internal power supply means includes an internal power supply node for outputting said internal power supply voltage, a driver transistor having a source/drain electrode connected to a first external power supply node, and another source/drain electrode connected to said internal power supply node, a resistance element having a terminal connected to said internal power supply node, a differential amplifier having an inverted input terminal receiving a prescribed reference voltage, a non-inverted input terminal connected to another terminal of said resistance element, and an output terminal connected to a gate electrode of said driver transistor, a control transistor having a source/drain electrode connected to said another terminal of said resistance element, and another source/drain electrode connected to a second external power supply node, and gate voltage supplying means for supplying a gate voltage to a gate electrode of said control transistor, said gate voltage supplying means including a gate node for outputting said gate voltage, a constant current source connected between said first external power supply node and said gate node, and a load transistor having a source/drain electrode connected to said gate node, another source/drain electrode connected to said second external power supply node, a front gate electrode connected to said second external power supply node, and a back gate electrode connected to said gate node.

* * * * *